US009697904B2

(12) United States Patent
Ahn

(10) Patent No.: US 9,697,904 B2
(45) Date of Patent: Jul. 4, 2017

(54) INTEGRATED CIRCUIT FOR MIRRORING AND AMPLIFYING A SENSING CURRENT AND OPERATION METHOD THEREOF

(71) Applicant: SK hynix Inc., Gyeonggi-do (KR)

(72) Inventor: Sung-Hoon Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 172 days.

(21) Appl. No.: 14/063,993

(22) Filed: Oct. 25, 2013

(65) Prior Publication Data

US 2014/0355354 A1 Dec. 4, 2014

(30) Foreign Application Priority Data

May 31, 2013 (KR) .................. 10-2013-0062445

(51) Int. Cl.
G11C 16/26 (2006.01)
G11C 16/06 (2006.01)

(52) U.S. Cl.
CPC ............. G11C 16/26 (2013.01); G11C 16/06 (2013.01)

(58) Field of Classification Search
CPC .................................................... G11C 16/26
USPC .............. 365/185.21, 185.22, 185.18, 185.2
See application file for complete search history.

(56) References Cited

U.S. PATENT DOCUMENTS

| 5,258,669 | A |   | 11/1993 | Nakashima |             |
|-----------|---|---|---------|-----------|-------------|
| 5,687,116 | A | * | 11/1997 | Kowshik   | G11C 16/12  |
|           |   |   |         |           | 365/185.03  |
| 8,238,163 | B2| * | 8/2012  | Park      | 365/185.22  |
| 8,335,107 | B2| * | 12/2012 | Lee       | 365/185.11  |
| 2007/0030731 | A1 | * | 2/2007 | Honda | G11C 16/28  |
|           |   |   |         |           | 365/185.2   |
| 2010/0195394 | A1 | * | 8/2010 | Park  | 365/185.16  |
| 2014/0063969 | A1 | * | 3/2014 | Yang  | 365/185.21  |

FOREIGN PATENT DOCUMENTS

KR         1020050049720           5/2005

* cited by examiner

Primary Examiner — Vanthu Nguyen
Assistant Examiner — Jerome Leboeuf
(74) Attorney, Agent, or Firm — IP & T Group LLP

(57) ABSTRACT

An integrated circuit includes a mirroring/amplifying unit suitable for mirroring and amplifying a sensing current that flows on a signal transmission line coupled to an internal circuit, and outputting an amplified current; a reference current generating unit suitable for generating a reference current; and a state determination unit suitable for comparing the reference current with the amplified current and determining a state of the internal circuit based on a comparison result.

17 Claims, 7 Drawing Sheets

INTEGRATED CIRCUIT FOR MIRRORING AND AMPLIFYING A SENSING CURRENT AND OPERATION METHOD THEREOF

CROSS-REFERENCE TO RELATED APPLICATIONS

The present application claims priority of Korean Patent Application No. 10-2013-0062445, flied on May 31, 2013, which is incorporated herein by reference in its entirety.

BACKGROUND

1. Field

Exemplary embodiments of the present invention relate to a semiconductor design technology, and, more particularly, to an integrated circuit and an operation method thereof for detecting an operation state of an internal circuit by sensing variation in a current amount flowing on a signal transmission line coupled to the internal circuit.

2. Description of the Related Art

Demand for a semiconductor device that performs a program operation and an erase operation without a refresh operation for rewriting data with a predetermined period has increased. A high integration technology for a memory device having a high-capacity memory for storing large amounts of data has developed. Herein, the program operation represents a write operation for writing data on a memory cell, and the erase operation represents an erase operation for erasing data stored on the memory cell.

Recently, a NAND-type flash memory device having a string composed of a plurality of memory cells, which are coupled in series, has developed. The NAND-type flash memory device sequentially reads information unlike a NOR-type flash memory device. The program operation and the erase operation of the NAND-type flash memory device are performed by injecting or ejecting electrons into a floating gate using an F-N tunneling manner and controlling a threshold voltage of the memory cells.

FIG. 1 is a block diagram illustrating a conventional flash memory device.

As illustrated in FIG. 1, the conventional flash memory device includes a memory cell array 10 having a plurality of memory cells and a page buffer 20.

The page buffer 20 includes a bit line selection unit 21, a precharge unit 22, and a register 23. The bit line selection unit 21 is coupled between a sensing node S0 and bit lines BLe and BLo. The precharge unit 22 is coupled to the sensing node S0. The register 23 is coupled between the sensing node S0 and an input/output terminal YA. The register 23 includes a latch 24 for temporally storing data.

The page buffer 20 transmits a program data to one of the bit lines BLe and BLo through the sensing node S0 that is precharged by the precharge unit 22 during a program operation, and stores data transmitted through one of the bit lines BLe and BLo in the latch 24 of the register 23 through the sensing node S0, which is precharged by the precharge unit 22, during a read operation. The sensing node S0 is precharged by the precharge unit 22 during various operation of a flash memory device such as a copy-back operation, a verification operation, the program operation, and the read operation.

More specifically, during the read operation for checking a program state or an erase state, cell current flowing on a memory cell to be read is sensed through the bit lines BLe and BLo, and a cell state of the memory cell is determined based on a sensed result. For example, if the memory cell to be read is the program state, a voltage level of the bit lines BLe and BLo maintains a level set by a precharge operation since the cell current does not flow. If the memory cell to be read is the erase state, a voltage level of the bit lines BLe and BLo is lowered than a level, which is set by the precharge operation, since the cell current flows. The cell state is checked by detecting such a state through the sensing node S0.

However, as the integration of a flash memory device is increased and power used in the flash memory device becomes lower, a cell current of a memory cell may be reduced. Thus, during the read operation for checking the cell state, a variation width of the voltage level of the bit lines BLe and BLo may be reduced, and a reading margin may be reduced. That is, during the read operation, a time for acquiring a sufficient variation width of the voltage level of the bit lines BLe and BLo may be increased, and an operation speed of devices may be reduced.

SUMMARY

Exemplary embodiments of the present invention are directed to an integrated circuit and an operation method thereof for detecting an operation state of an internal circuit by minimizing malfunction in a sensing circuit for detecting the operation state of the internal circuit by sensing variation in a current amount flowing on a signal transmission line coupled to the internal circuit.

Moreover, exemplary embodiments of the present invention are directed to an integrated circuit and an operation method thereof for detecting an operation state of an internal circuit by minimizing current consumption by gradually detecting the operation state of the internal circuit in a sensing circuit for detecting the operation state of the internal circuit by sensing variation in a current amount flowing on a signal transmission line coupled to the internal circuit.

In accordance with an exemplary embodiment of the present invention, an integrated circuit may include a mirroring/amplifying unit suitable for mirroring and amplifying a sensing current that flows on a signal transmission line coupled to an internal circuit, and outputting an amplified current, a reference current generating unit suitable for generating a reference current, and a state determination unit suitable for comparing the reference current with the amplified current and determining a state of the internal circuit based on a comparison result.

In accordance with another exemplary embodiment of the present invention, an integrated circuit may include a mirroring/amplifying unit suitable for mirroring and amplifying a sensing current that flows on a signal transmission line coupled to an internal circuit, outputting an amplified current, adjusting a magnitude of the amplified current in response to an amplifying code, and being controlled in response to a determination signal; a reference current generating unit suitable for generating a reference current; a state determination unit suitable for determining a first state of the internal circuit by comparing the reference current with a first amplified current, determining a logic level of the determination signal in response to a first determination result, and determining a second state of the internal circuit by selectively comparing the reference current with a second amplified current in response to the determination signal; and a code setting unit suitable for setting the amplifying code to a first value or a second value and controlling the mirroring/amplifying unit to generate the first amplified current or the second amplified current, which is different from the first amplified current.

In accordance with another exemplary embodiment of the present invention, an operation method of an integrated circuit may include generating a reference current; mirroring a sensing current that flows between a sensing node and a signal transmission line coupled to an internal circuit, amplifying the sensing current by a first multiple in response to a first amplifying code, and generating a first amplified current; determining whether the internal circuit is set to a first state by comparing the reference current with the first amplified current based on a first determination result, mirroring the sensing current, amplifying the sensing current by a second multiple in response to a second amplifying code, and generating a second amplified current; and based on the first determination result, determining whether the internal circuit is set to a second state by comparing the reference current with the second amplified current.

The determining whether the internal circuit is set to a first state, or the determining whether the internal circuit is set to a second state includes supplying the first amplified current or the second amplified current corresponding to the first amplifying code or the second amplifying code as a sourcing current to the determination node by mirroring the sensing current between the determination node and a power supply voltage terminal, determining a voltage level of the determination node based on a magnitude difference between the reference current as a sinking current and the first amplified current or the second amplified current as a sourcing current, the reference current flowing between the determination node and a ground voltage terminal, and determining the voltage level of the determination node as a logic level based on a logic determination level.

The determining whether the internal circuit is set to a first state, or the determining whether the internal circuit is set to a second state includes supplying the first amplified current or the second amplified current corresponding to the first amplifying code or the second amplifying code as the sinking current to the determination node by mirroring the sensing current between the determination node and a ground voltage terminal, determining a voltage level of the determination node based on a magnitude difference between the reference current as the sourcing current and the first amplified current or the second amplified current as the sinking current, the reference current flowing between the determination node and a power supply voltage terminal, and determining the voltage level of the determination node as a logic level based on a logic determination level.

DETAILED DESCRIPTION

Figure 1:
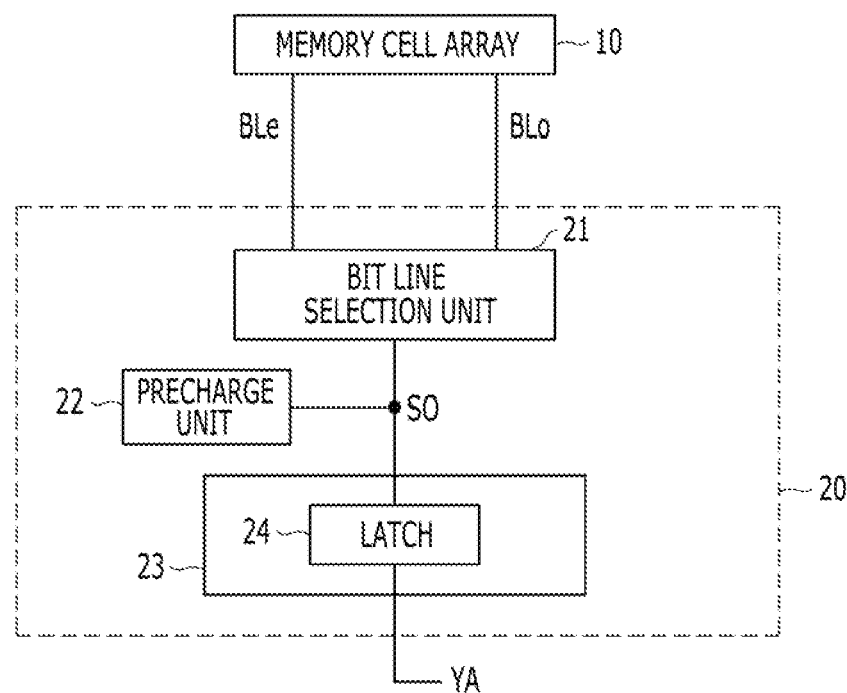
FIG. 1 is a block diagram illustrating a conventional flash memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
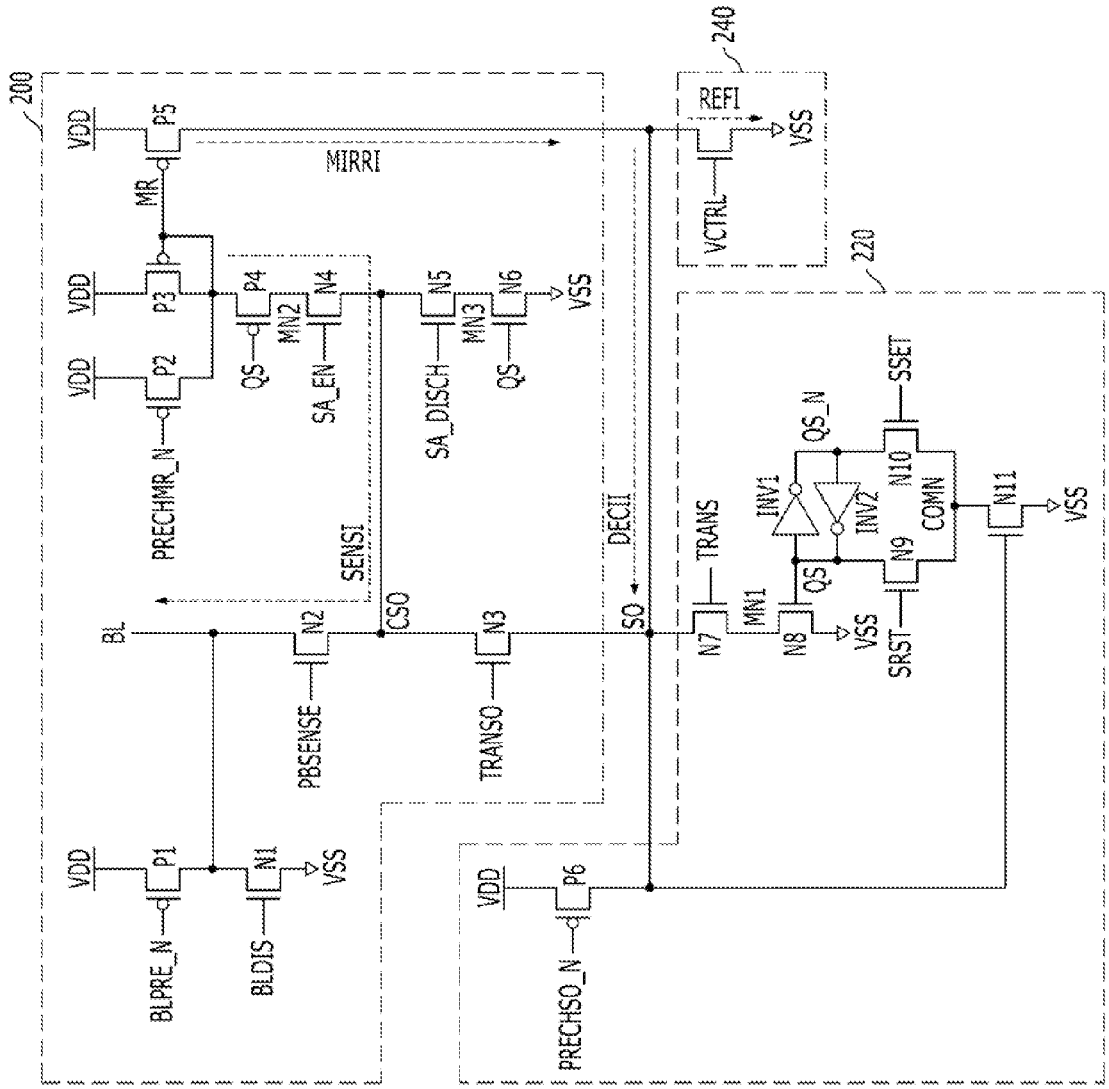
FIG. 2 is a circuit diagram illustrating a page buffer of a flash memory device for reading a cell data using a current sensing manner.

FIG. 2 is a circuit diagram illustrating a page buffer of a flash memory device for reading a cell data using a current sensing manner.

As illustrated in FIG. 2, the page buffer of the flash memory device for reading the cell data using the current sensing manner includes a mirroring unit 200, a reference current generating unit 240, and a state determination unit 220.

The mirroring unit 220 generates a mirroring current MIRRI by mirroring a sensing current SENSI, which flows on a bit line BL coupled to a memory cell (not shown).

The reference current generating unit 240 generates a reference current REFI having a predetermined magnitude.

The state determination unit 220 compares the reference current REFI with the mirroring current MIRRI and determines a state of the memory cell coupled to the bit line based on a comparison result.

Hereinafter, an operation of the page buffer will be described below. A magnitude of the sensing current SENSI is determined based on the state of the memory cell coupled to the bit line BL. For example, if the state of the memory cell coupled to the bit line BL is an erase state, since current having a relatively large amount may flow on the memory cell, the sensing current SENSI having a relatively large amount may flow on the memory cell via the bit line BL and a sourcing node CS0 from a sensing node MR. If the state of the memory cell coupled to the bit line BL is a program state, since current may not flow on the memory cell, the sensing current SENSI having a relatively small amount may flow on the memory cell via the bit line BL and the sourcing node CS0 from the sensing node MR.

Since a transistor N2 for fixing a voltage level (hereinafter, referring to as a "level fixing transistor N2") is coupled between the sourcing node CS0 and the bit line BL, a voltage level of the bit line BL is fixed at a predetermined voltage level VBL, and a magnitude of the sensing current SENSI is varied. That is, a level fixing signal PBSENSE applied to a gate of the level fixing transistor N2 is set to a combined voltage of a threshold voltage VTH of the level fixing transistor N2 and the predetermined voltage level VBL. Thus, when a voltage level of the sourcing node CS0 is higher than the predetermined voltage level VBL, the bit line BL may have the predetermined voltage VBL. Since the level fixing transistor N2 is turned on by the level fixing signal PBSENSE, the level fixing transistor N2 does not have any influence on the sensing current SENSI, which flows between the bit line BL and the sourcing node CS0.

Meanwhile, since the sensing current SENSI is outputted from the sensing node MR, and a voltage level of the sensing node MR is lowered, the sensing node MR is coupled to a power supply voltage (VDD) terminal. Thus, the magnitude of the sensing current SENSI, which is determined based on the state of the memory cell, may be maintained for a state sensing period of the memory cell.

Moreover, since the magnitude of the sensing current SENSI is determined by the voltage level of the sensing node MR based on the state of the memory cell coupled to the bit line BL, the mirroring current MIRRI having a magnitude substantially the same as the sensing current SENSI flows on a determination node S0, which is coupled to the sensing node MR in a current mirror type.

Since the mirroring current MIRRI flows between the determination node S0 and the VDD terminal, the mirroring current MIRRI may be supplied to the determination node S0 as a sourcing current. Since the reference current REFI generated from the reference current generating unit 240 flows between the determination node S0 and a ground voltage (VSS) terminal, the reference current REFI may be supplied to the determination node S0 as a sinking current.

Thus, since the mirroring current MIRRI is sourced and the reference current REFI is sunken on the determination node S0, if a magnitude of the mirroring current MIRRI is larger than a magnitude of the reference current REFI, a voltage level of the determination node S0 may be maintained at a high level. If the magnitude of the mirroring current MIRRI is smaller than the magnitude of the reference current REFI, the voltage level of the determination node S0 may be maintained at a low level. That is, the voltage level of the determination node S0 may be varied based on a combination of the mirroring current MIRRI and the reference current REFI. For example, if the memory cell coupled to the bit line BL is under an erase state and the sensing current SENSI and the mirroring current MIRRI have relatively large magnitude, the magnitude of the mirroring current MIRRI is larger than the magnitude of the reference current REFI. Thus, the determination node S0 may have a voltage level close to that of a power supply voltage VDD.

If the memory cell coupled to the bit line BL is under a program state and the sensing current SENSI and the mirroring current MIRRI have relatively small magnitude, the magnitude of the mirroring current MIRRI is smaller than the magnitude of the reference current REFI. Thus, the determination node S0 may become a voltage level close to that of the ground voltage VSS.

The state determination unit 220 determines whether the voltage level of the determination node S0, which is determined based on a combination of the mirroring current MIRRI and the reference current REFI, is higher than a logic determination level or not, and determines a logic level of a determination signal QS. For example, if the determination node S0 has a voltage level close to that of the power supply voltage VDD, the determination signal QS may become a logic high level. If the determination node S0 has a voltage level close to that of the ground voltage VSS, the determination signal QS may become a logic low level.

More specifically, the state determination unit 220 activates a determination setting signal SSET at a sufficient variation of a voltage level of the determination node S0 based on the combination of the mirroring current MIRRI and the reference current REFI for a sufficient time. Thus, a logic level of the determination signal QS is determined in response to an activation of the determination setting signal SSET.

For example, during a precharge operation period, the sourcing node CS0 and an inverted determination signal (QS_N) output terminal is precharged with the power supply voltage VDD. After the mirroring current MIRRI and the reference current REFI are combined, if a voltage level of the determination node S0 is varied to a voltage level close to that of the power supply voltage VDD, the QS_N output terminal is coupled to the VSS terminal during an activation period of the determination setting signal SSET. Thus, the inverted determination signal QS_N is set to a logic low level, and the determination signal QS is set to a logic high level.

Moreover, after the mirroring current MIRRI and the reference current REFI are combined, if a voltage level of the determination node S0 is varied to a voltage level close to that of the ground voltage VSS, the QS_N output terminal is not coupled to the VSS terminal during an activation period of the determination setting signal SSET. Thus, the inverted determination signal QS_N maintains a logic high level, and the determination signal QS maintains a logic low level.

The logic level of the determination signal QS is determined by aforementioned operation. After the logic level of the determination signal QS is determined, it is determined whether the memory cell coupled to the bit line BL is under an erase state or a program state. Moreover, in the aforementioned operation, since the logic level of the determination signal QS is determined based on a magnitude of the sensing current SENSI when the voltage level of the bit line BL is fixed to a predetermined voltage level VBL, an extended time for determining the state of the memory cell may be overcome. Since a loading, according to a length between the sourcing node CS0 and the sensing node MR, is shorter than a loading, according to a length of the bit line BL, it may be possible to determine the logic level of the determination signal QS through variation of the voltage level, which is sensitive to the state of the memory cell.

However, as illustrated in FIG. 2, in the case of a page buffer of a flash memory device for reading a cell data using a current sensing manner, when an erase state of the memory cell is definitely distinct from a program state of the memory cell, the logic level of the determination signal QS may be determined. That is, when the state of the memory cell is not definite, for example, in the case of an erase state of the memory cell having a threshold voltage, which is close to a program state, or, in the case of a program state of the memory cell having a threshold voltage, which is close to an erase state of the memory cell, the logic level of the determination signal QS may not be determined.

Thus, embodiments of the present invention will be described below to overcome the concerns of a page buffer of a flash memory device for reading a cell data using a current sensing manner as illustrated in FIG. 2.

Figure 3:
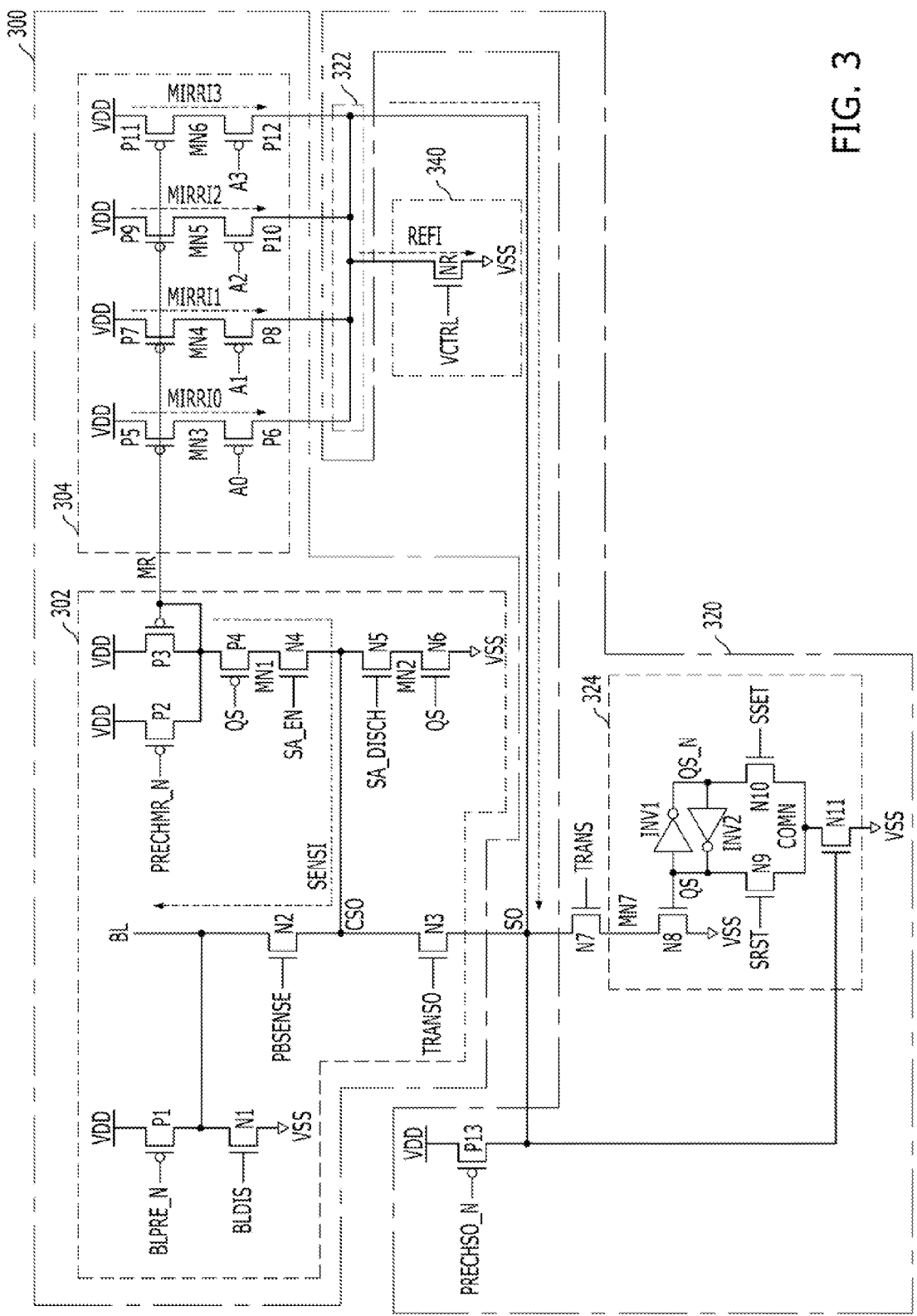
FIG. 3 is a circuit diagram illustrating a page buffer of a flash memory device for reading a cell data using a current sensing manner in accordance with a first embodiment of the present invention.

FIG. 3 is a circuit diagram illustrating a page buffer of a flash memory device for reading a cell data using a current sensing manner in accordance with a first embodiment of the present invention.

As illustrated in FIG. 3, the page buffer of the flash memory device for reading the cell data using the current sensing manner in accordance with the first embodiment of the present invention includes a mirroring/amplifying unit 300, a reference current generating unit 340, and a state determination unit 320.

The mirroring/amplifying unit 300 generates an amplified current MIRRI<0:3> by mirroring and amplifying current, which flows on a bit line BL coupled to a memory cell (not shown). A magnitude of the amplified current MIRRI<0:3> is adjusted in response to an amplifying code A<0:3>. The mirroring/amplifying unit 300 includes a current supply unit 302 and a current amplifying unit 304.

The current supply unit 302 generates a sensing current SENSI flow via the bit line BL and a sourcing node CS0 between a sensing node MR and the memory cell (not shown) based on a state of the memory cell coupled to the bit line BL.

More specifically, the current supply unit 302 includes a level fixing transistor N2, a sensing enable transistor N4, a first determination transistor P4, a sensing precharge transistor P2, a sensing transistor P3, a sensing discharge transistor N5, and a second determination transistor N6. The current supply unit 302 further includes a bit line precharge transistor P1, a bit line discharge transistor N1, and a node connection transistor N3.

The level fixing transistor N2 is coupled between a sourcing node CS0 and the bit line BL and has a gate receiving a level fixing signal PBSENSE. The level fixing transistor N2 fixes a voltage level of the bit line BL to a predetermined voltage level VBL irrespective of variation in a current amount of the sensing current SENSI, which flows between the sourcing node CS0 and the bit line BL, in response to the level fixing signal PBSENSE.

The sensing enable transistor N4 is coupled between a first intermediate node MN1 and the sourcing node CS0 and has a gate receiving a sensing enable signal SA_EN. The sensing enable transistor N4 controls a connection between the first intermediate node MN1 and the sourcing node CS0 in response to the sensing enable signal SA_EN.

The first determination transistor P4 is coupled between the sensing node MR and the first intermediate node MN1 and has a gate receiving a determination signal QS. The first determination transistor P4 controls a connection between the sensing node MR and the first intermediate node MN1 in response to the determination signal QS.

The sensing precharge transistor P2 is coupled between a power supply voltage (VDD) terminal and the sensing node MR and has a gate receiving a sensing precharge signal PRECHMR_N. The sensing precharge transistor P2 controls a connection between the (VDD) terminal and the sensing node MR in response to the sensing precharge signal PRE-CHMR_N.

The sensing transistor P3 is coupled between the VDD terminal and the sensing node MR and has a gate commonly coupled to the sensing node MR. The sensing transistor P3 adjusts a magnitude of the sensing current SENSI, which flows on the sensing node MR from the VDD terminal based on a voltage level of the sensing node MR.

The sensing discharge transistor N5 is coupled between the sourcing node CS0 and a second intermediate node MN2, and a gate receiving a sensing discharge signal SA_DISCH. The sensing discharge transistor N5 controls a connection between the sourcing node CS0 and the second intermediate node NM2 in response to the sensing discharge signal SA_DISCH.

The second determination transistor N6 is coupled between the second intermediate node MN2 and a ground voltage (VSS) terminal, and a gate receiving the determination signal QS. The second determination transistor N6 controls a connection between the second intermediate node MN2 and the VSS terminal in response to the determination signal QS.

The bit line precharge transistor P1 is coupled between the VDD terminal and the bit line BL, and a gate receiving a bit line precharge signal BLPRE_N. The bit line precharge transistor P1 controls a connection between the VDD terminal and the bit line BL in response to the bit line precharge signal BLPRE_N.

The bit line discharge transistor N1 is coupled between the bit line BL and the VSS terminal, and a gate receiving a bit line discharge signal BLDIS. The bit line discharge transistor N1 controls a connection between the bit line BL and the VSS terminal in response to the bit line discharge signal BLDIS.

The node connection transistor N3 is coupled between the sourcing node CS0 and a determination node S0, and a gate receiving a node connection signal TRANS0. The node connection transistor N3 controls a connection between the sourcing node CS0 and the determination node S0 in response to the node connection signal TRANS0.

The current amplifying unit 304 is coupled to the current supply unit 302 through the sensing node MR in a current mirror type and provides the amplified current MIRRI<0:3>, which is generated by amplifying the sensing current SENSI by a multiple determined by the amplifying code A<0:3> to the determination node S0.

More specifically, the current amplifying unit 304 includes a first amplifying transistor P5, a first connection transistor P6, a second amplifying transistor P7, a second connection transistor P8, a third amplifying transistor P9, a third connection transistor P10, a fourth amplifying transistor P11, and a fourth connection transistor P12.

The first amplifying transistor P5 is coupled between the VDD terminal and a third intermediate node MN3, and a gate receiving a voltage level of the sensing node MR. The first amplifying transistor P5 adjusts a magnitude of a first mirroring current MIRRI0, which flows from the VDD terminal to the third intermediate node MN3 in response to the voltage level of the sensing node MR.

The first connection transistor P6 is coupled between the third intermediate node MN3 and the determination node S0, and a gate receiving a first bit A0 of an amplifying code A<0:3>. The first connection transistor P6 controls a connection between the third intermediate node MN3 and the determination node S0 in response to the first bit A0 of the amplifying code A<0:3>.

The second amplifying transistor P7 is coupled between the VDD terminal and a fourth intermediate node MN4, and a gate receiving the voltage level of the sensing node MR. The second amplifying transistor P7 adjusts a magnitude of a second mirroring current MIRRI1, which flows from the VDD terminal to the fourth intermediate terminal node MN4 in response to the voltage level of the sensing node MR.

The second connection transistor P8 is coupled between the fourth intermediate node MN4 and the determination node S0, and a gate receiving a second bit A1 of the amplifying code A<0:3>. The second connection transistor P8 controls a connection between the fourth intermediate terminal node MN4 and the determination node S0 in response to the second bit A1 of the amplifying code A<0:3>.

The third amplifying transistor P9 is coupled between the VDD terminal and a fifth intermediate node MN5, and a gate receiving the voltage level of the sensing node MR. The third amplifying transistor P9 adjusts a magnitude of a third mirroring current MIRRI2, which flows from the VDD terminal to the fifth intermediate terminal node MN5 in response to the voltage level of the sensing node MR.

The third connection transistor P10 is coupled between the fifth intermediate node MN5 and the determination node S0, and a gate receiving a third bit A2 of the amplifying code A<0:3>. The third connection transistor P10 controls a connection between the fifth intermediate terminal node MN5 and the determination node S0 in response to the third bit A2 of the amplifying code A<0:3>.

The fourth amplifying transistor P11 is coupled between the VDD terminal and a sixth intermediate node MN6, and a gate receiving the voltage level of the sensing node MR. The fourth amplifying transistor P11 adjusts a magnitude of a fourth mirroring current MIRRI3, which flows from the VDD terminal to the sixth intermediate terminal node MN6 in response to the voltage level of the sensing node MR.

The fourth connection transistor P12 is coupled between the sixth intermediate node MN6 and the determination node S0, and a gate receiving a fourth bit A3 of the amplifying code A<0:3>. The fourth connection transistor P12 controls a connection between the sixth intermediate terminal node MN6 and the determination node S0 in response to the fourth bit A3 of the amplifying code A<0:3>.

The reference current generating unit 340 generates a reference current REFI having a predetermined magnitude.

More specifically, the reference current generating unit 340 includes a reference control transistor NR, which is coupled between the determination node S0 and the VSS terminal, and a gate receiving a reference control voltage VCTRL. The reference control transistor NR adjusts a magnitude of the reference current REFI, which flows between the determination node S0 and the VSS terminal in response to the reference control voltage VCTRL.

The state determination unit 320 compares a magnitude of the reference current REFI with a magnitude of the amplified current MIRRI<0:3>, and determines the state of the memory cell coupled to the bit line BL based on a comparison result. The state determination unit 320 includes a level determination unit 322 and a logic level determination unit 324.

The level determination unit 322 determines a voltage level of the determination node S0 based on a magnitude difference between the reference current REFI as a sinking current and the amplified current MIRRI<0:3> as a sourcing current by providing the reference current REFI as the sinking current to the determination node S0 and by providing the amplified current MIRRI<0:3> as the sourcing current to the determination node S0. That is, an entire configuration of the level determination unit 322 represents that the determination node S0 is coupled between the current amplifying unit 304 and the reference current generating unit 340.

The logic level determination unit 324 determines a logic level of the determination signal QS and an inverted determination signal QS_N by determining the voltage level of the determination node S0 as a logic level on the basis of a logic determination level.

More specifically, the logic level determination unit 324 includes a sourcing precharge transistor P13, a connection control transistor N7, a determination transistor N8, a first inverter INV1, a second inverter INV2, a determination reset transistor N9, a determination setting transistor N10, and a sinking transistor N11.

The sourcing precharge transistor P13 is coupled between the VDD terminal and the determination node S0, and has a gate receiving a sourcing precharge signal PRECHS0_N. The sourcing precharge transistor P13 controls a connection between the VDD terminal and the determination node S0 in response to the sourcing precharge signal PRECHS0_N.

The connection control transistor N7 is coupled between the determination node S0 and a seventh intermediate node MN7, and has a gate receiving a connection control signal TRANS. The connection control transistor N7 controls a connection between the determination node S0 and the seventh intermediate node MN7 in response to the connection control signal TRANS.

The determination transistor N8 is coupled between the seventh intermediate node MN7 and the VSS terminal, and has a gate receiving the determination signal QS. The determination transistor N8 controls a connection between the seventh intermediate node MN7 and the VSS terminal in response to the determination signal QS.

The first inverter INV1 inverts the determination signal QS and outputs the inverted determination signal QS_N. The second inverter INV2, which of its input/output terminals are coupled to output/input terminals of the first inverter INV1, respectively, inverts the inverted determination signal QS_N and outputs the determination signal QS.

The determination reset transistor N9 is coupled between a determination signal (QS) output terminal and a common node COMN, and has a gate receiving a determination reset signal SRST. The determination reset transistor N9 controls a connection between the QS output terminal and the common node COMN in response to the determination reset signal SRST.

The determination setting transistor N10 is coupled between an inverted determination signal (QS_N) output terminal and the common node COMN, and has a gate receiving a determination setting signal SSET. The determination setting transistor N10 controls a connection between the QS_N output terminal and the common node COMN in response to the determination setting signal SSET.

The sinking transistor N11 is coupled between the common node COMN and the VSS terminal, and has a gate receiving a voltage level of the determination node S0. The sinking transistor N11 adjusts an amount of the current, which flows between the common node COMN and the VSS terminal in response to the voltage level of the determination node S0.

Hereinafter, an operation of the page buffer of the flash memory device for reading the cell data using the current sensing manner in accordance with the first embodiment of the present invention will be described below.

The operation of the page buffer of the flash memory device in accordance with the first embodiment of the present invention includes a precharge operation period and a sensing operation period.

During the precharge operation period, signals PRECH-MR_N, PRECHS0_N, BLPRE_N related to a precharge operation, and a signal SRST related to an initializing operation are activated, and a voltage level of nodes for performing a normal sensing operation period is set.

For example, during the precharge operation period, the sensing node MR, the determination node S0 and the bit line BL are coupled to the VDD terminal and are set to the power supply voltage VDD. Moreover, during the precharge operation period, the QS terminal is coupled to the VSS terminal and is set to the ground voltage VSS. The inverted determination signal QS_N is set to the power supply voltage VDD.

In order to enter the sensing operation period, the mirroring/amplifying unit 300, the reference current generating unit 340, and the state determination unit 320 operate accordingly as signals PBSENSE, SA_EN, A<0:3>, SSET, VCTRL related to a sensing operation are activated at a suitable time.

First, at the timing when the level fixing signal PBSENSE and the sensing enable signal SA_EN are enabled, the bit line BL, the sourcing node CS0, and the sensing node MR are coupled to each other. The magnitude of the sensing current SENSI, which flows from the sensing node MR to the bit line BL, is determined based on the state of the memory cell coupled to the bit line.

For example, when the state of the memory cell coupled to the bit line BL is an erase state, since current having a relatively large magnitude may flow on the memory cell, the sensing current having a relatively large magnitude may flow from the sensing node MR to the memory cell via the sourcing node CS0 and the bit line BL.

When the state of the memory cell coupled to the bit line BL is a program state, since current may not flow on the memory cell, the sensing current having a relatively small magnitude may flow from the sensing node MR to the memory cell via the sourcing node CS0 and the bit line BL.

In a state that the voltage level of the bit line BL is fixed to the predetermined voltage level VBL, the magnitude of the sensing current SENSI, which flows on the bit line BL, is varied since the level fixing transistor N2 is coupled between the sourcing node CS0 and the bit line BL. That is, the level fixing signal PBSENSE inputted to the gate of the level fixing transistor N2 is set to a voltage level as a combined voltage of the threshold voltage VTH of the level fixing transistor N2 and the predetermined voltage level VBL. Thus, during a period having a state that the voltage level of the sourcing node CS0 is higher than the predetermined voltage level VBL, the bit line BL may have the predetermined voltage level VBL. Since the level fixing transistor N2 is turned on in response to the level fixing signal PBSENSE, the level fixing transistor N2 does not have any influence on the sensing current SENSI, which flows between the sourcing node CS0 and the bit line BL.

Meanwhile, as the sensing current SENSI is outputted from the sensing node MR, the voltage level of the sensing node MR is lowered, and the sensing node MR is coupled to the VDD terminal. As a result, the magnitude of the sensing current SENSI, which is once determined based on the state of the memory cell, may be maintained during the sensing operation period.

Since the magnitude of the sensing current SENSI is determined by the voltage level of the sensing node MR based on the state of the memory cell coupled to the bit line BL, the current amplifying unit 304 may generate the amplified current MIRRI<0:3> having a magnitude substantially the same as the sensing current SENSI. A current amount of the amplified current MIRRRI<0:3> provided to the determination node S0 may be varied in response to the amplifying code A<0:3>.

For example, when the first bit A0 of the amplifying code A<0:3> is activated and the other bits A<1:3> are inactivated, only the first mirroring current MIRRI0 is generated and provided to the determination node S0. That is, the current amplifying unit 304 provides the first mirroring current MIRRI0 to the determination node S0.

When the first bit A0 of the amplifying code A<0:3> is inactivated and the other bits A<1:3> are activated, the second to fourth mirroring current MIRRI<1:3> are generated and provided to the determination node S0 in parallel. That is, the current amplifying unit 304 provides the second to fourth mirroring current MIRRI<1:3> to the determination node S0. A current amount of the second to fourth mirroring current MIRRI<1:3> becomes an amount so that the sensing current SENSI is amplified three times.

That is, the current amplifying unit 304 provides the amplified current MIRRI<0:3> to the determination node S0 by amplifying the sensing current SENSI in response to the amplifying code A<0:3>.

For reference, in the drawings, since the amplifying code A<0:3> is a signal having four bits, the current amplifying unit 304 may amplify the sensing current SENSI by a first to fourth times. However, in another embodiment of the present invention, the amplifying code may be a signal having less or more than four bits, and the current amplifying unit may adjust a multiple times for amplifying the sensing current SENSI in response to the amplifying code.

Meanwhile, since the amplified current MIRRI<0:3> generated from the current amplifying unit 304 flows between the VDD terminal and the determination node S0, the amplified current MIRRI<0:3> as the sourcing current may be provided to the determination node S0. Since the reference current REFI generated from the reference current generating unit 340 flows between the determination node S0 and the VSS terminal, the reference current REFI as the sinking current may be provided to the determination node S0.

As described above, since the amplified current MIRRI<0:3> as the sourcing current and the reference current REFI as the sinking current are combined at the determination node S0, when the magnitude of the amplified current MIRRI<0:3> is larger than that of the reference current REFI, the determination node S0 may be maintained at a high voltage level, and, when the magnitude of the amplified current MIRRI<0:3> is smaller than that of the reference current REFI, the determination node S0 may be maintained at a low voltage level. That is, the voltage level of the determination node S0 may be varied based on a combined result of the amplified current MIRRI<0:3> and the reference current REFI at the determination node S0.

For example, when the state of the memory cell coupled to the bit line BL is the erase state, and the magnitude of the sensing current SENSI and the amplified current MIRRI<0:3> is relatively large, the magnitude of the amplified current MIRRI<0:3> is larger than the magnitude of the reference current REFI. Thus, the determination node S0 may have a voltage level close to that of the power supply voltage VDD.

When the state of the memory cell coupled to the bit line BL is the program state, and the magnitude of the sensing current SENSI and the amplified current MIRRI<0:3> is relatively small, the magnitude of the amplified current MIRRI<0:3> is smaller than the magnitude of the reference current REFI. Thus, the determination node S0 may have a voltage level close to that of the ground voltage VSS.

The state determination unit 320 determines the logic level of the determination signal QS by determining whether the voltage level of the determination node S0 is higher than the logic determination level or not.

For example, when the determination node S0 has a voltage level close to that of the power supply voltage VDD, the determination signal QS has a logic high level. In the case that the determination node S0 has a voltage level close to that of the ground voltage VSS, the determination signal QS has a logic low level.

More specifically, the state determination unit 320 activates the determination setting signal SSET at the time of a sufficient variation of the voltage level of the determination node S0 by combining the amplified current MIRRI<0:3> and the reference current REFI for a sufficient time. The logic level of the determination signal QS is determined by varying the voltage level of the QS_N output terminal in response to an activation of the determination setting signal SSET.

For example, during the precharge operation period, the sourcing node CS0 and the QS_N output terminal are precharged with the power supply voltage VDD. When the voltage level of the determination node S0 is varied to a voltage level close to that of the power supply voltage VDD after the amplified current MIRRI<0:3> and the reference current REFI are combined, the QS_N output terminal is coupled to the VSS terminal while the determination setting signal SSET is activated. Thus, the inverted determination signal QS_N is set to the logic low level, and the determination signal QS is set to the logic high level.

Moreover, when the voltage level of the determination node S0 is varied to a voltage level close to that of the ground voltage VSS after the amplified current MIRRI<0:3> and the reference current REFI are combined, the QS_N output terminal is not coupled to the VSS terminal while the determination setting signal SSET is activated. Thus, the inverted determination signal QS_N maintains the logic high level, and the determination signal QS maintains the logic low level.

After the logic level of the determination signal QS is determined, it may be determined that the state of the memory cell coupled to the bit line BL is the erase state or the program state. Moreover, in the aforementioned operation, while the voltage level of the bit line BL is fixed to the predetermined voltage level VBL, the logic level of the determination signal QS is determined based on the magnitude of the sensing current SENSI. Thus, it may solve the concern by taking an extended time to determine the state of the memory cell. That is, since a loading caused by a length between the sensing node MR and the sourcing node CS0 is shorter than a loading caused by a length of the bit line BL, the logic level of the determination signal QS may be determined by variation of the voltage level, which is sensitive and rapid to the state of the memory cell.

Moreover, the amplified current MIRRI<0:3> has a magnitude that is generated by amplifying the sensing current SENSI by a multiple determined by the amplifying code A<0:3>. Thus, if the state of the memory cell is definitely distinguished between the erase state and the program state, the magnitude of the sensing current SENSI is relatively large. Accordingly, the logic level of the determination signal QS may be determined on the basis of the amplified current MIRRI<0:3>, which is generated by amplifying the sensing current SENSI by one time.

When the state of the memory cell is not definitely distinguished between the erase state and the program state, e.g., in the case that, although the state of the memory cell is the erase state, the memory cell has a threshold voltage close to the program state, or, in the case that, although the state of the memory cell is the program state, the memory cell has a threshold voltage close to the erase state, the magnitude of the sensing current SENSI is relatively small. Accordingly, the logic level of the determination signal QS may be determined on the basis of the amplified current MIRRI<0:3>, which is generated by amplifying the sensing current SENSI by a multiple in response to the amplifying code A<0:3>.

That is, the page buffer of the flash memory device in accordance with the first embodiment of the present invention illustrated in FIG. 3 may overcome the concerns of the page buffer of the flash memory illustrated in FIG. 2.

Figure 4:
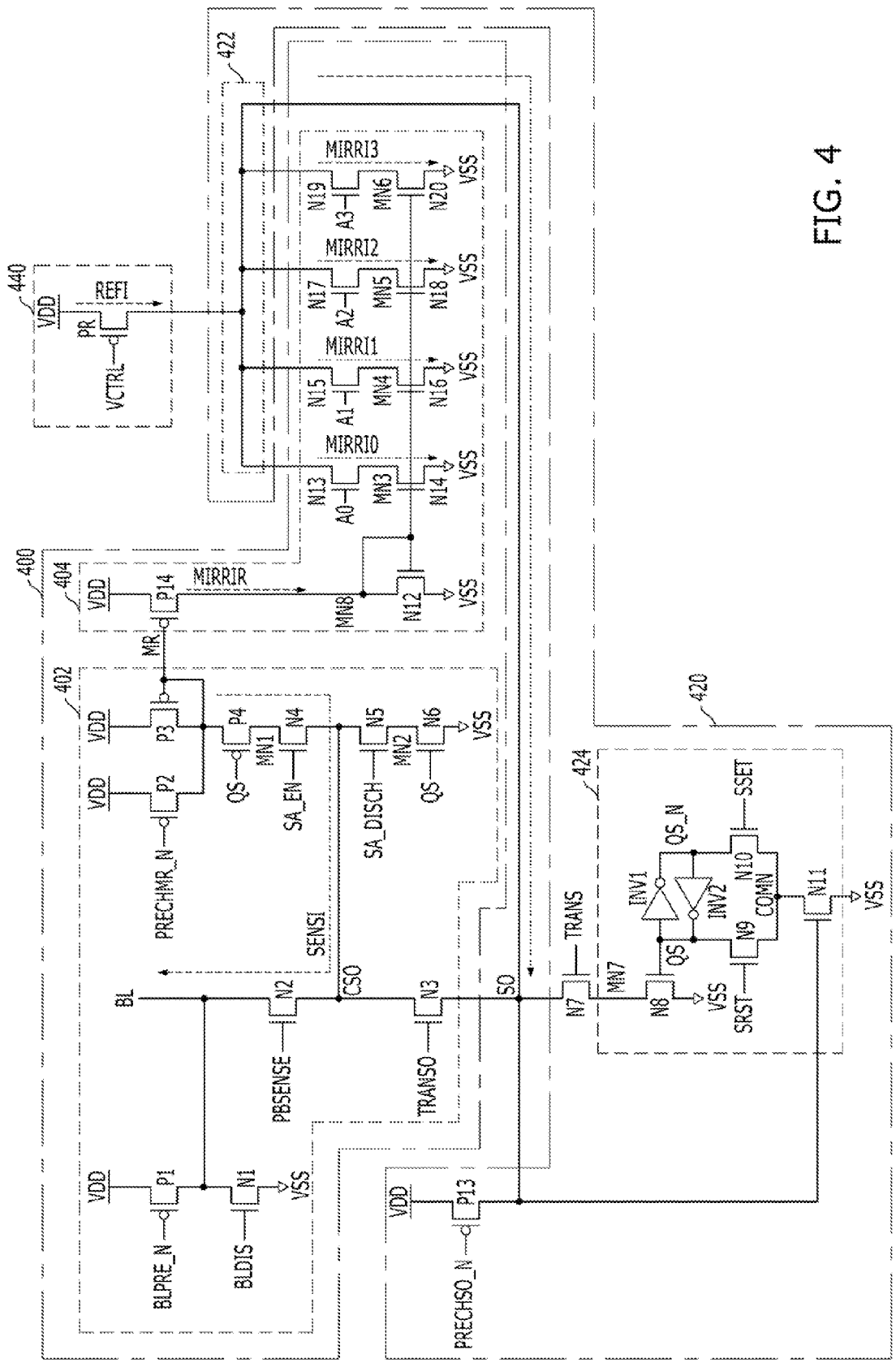
FIG. 4 is a circuit diagram illustrating a page buffer of a flash memory device for reading a cell data using a current sensing manner in accordance with a second embodiment of the present invention.

FIG. 4 is a circuit diagram illustrating a page buffer of the flash memory device for reading a cell data using a current sensing manner in accordance with a second embodiment of the present invention. In FIG. 4, elements that are identical to constituent elements illustrated in FIG. 3 are assigned the same reference numerals and repeated explanations thereof will be omitted or simplified.

As illustrated in FIG. 4, the page buffer of the flash memory device for reading the cell data using the current sensing manner in accordance with the second embodiment of the present invention includes a mirroring/amplifying unit 400, a reference current generating unit 440, and a state determination unit 420.

The mirroring/amplifying unit 400 generates an amplified current MIRRI<0:3> by mirroring and amplifying current, which flows on a bit line BL coupled to a memory cell (not shown). A magnitude of the amplified current MIRRI<0:3> is adjusted in response to an amplifying code A<0:3>. The mirroring/amplifying unit 400 includes a current supply unit 402 and a current amplifying unit 404.

The current supply unit 402 generates a sensing current SENSI flow via the bit line BL and a sourcing node CS0 between a sensing node MR and the memory cell (not shown) based on a state of the memory cell coupled to the bit line BL.

More specifically, the current supply unit 402 includes a level fixing transistor N2, a sensing enable transistor N4, a first determination transistor P4, a sensing precharge transistor P2, a sensing transistor P3, a sensing discharge transistor N5, and a second determination transistor N6. The current supply unit 402 further includes a bit line precharge transistor P1, a bit line discharge transistor N1, and a node connection transistor N3. Since the above transistors provided in the current supply unit 402 are substantially the same as constituent elements of the current supply unit 302 shown in FIG. 3, their detailed description will be omitted.

The current amplifying unit 404 is coupled to the current supply unit 402 in a current mirror type through the sensing node MR and provides the amplified current MIRRI<0:3>, which is generated by amplifying the sensing current SENSI by a multiple determined by the amplifying code A<0:3> to a determination node S0.

More specifically, the current amplifying unit 404 includes a first mirroring transistor P14, a second mirroring transistor N12, a first connection transistor N13, a first amplifying transistor N14, a second connection transistor N15, a second amplifying transistor N16, a third connection transistor N17, a third amplifying transistor N18, a fourth connection transistor N19, and a fourth amplifying transistor N20.

The first mirroring transistor P14 is coupled between a power supply voltage (VDD) terminal and an eighth intermediate node MN8, and a gate receiving a voltage level of the sensing node MR. The first mirroring transistor adjusts a magnitude of a reference mirroring current MIRRIR, which flows from the VDD terminal to the eighth intermediate node MN8 in response to the voltage level of the sensing node MR.

The second mirroring transistor N12 is coupled between the eighth intermediate node MN8 and a ground voltage (VSS) terminal, and a gate commonly coupled to the eighth intermediate node MN8. The second mirroring transistor N12 mirrors the reference mirroring current MIRRIR.

The first connection transistor N13 is coupled between the determination node S0 and a third intermediate node MN3, and a gate receiving a first bit A0 of the amplifying code A<0:3>. The first connection transistor N13 controls a connection between the determination node S0 and the third intermediate node MN3 in response to the first bit A0 of the amplifying code A<0:3>.

The first amplifying transistor N14 is coupled between the third intermediate node MN3 and the VSS terminal, and a gate receiving a voltage level of the eighth intermediate node MN8. The first amplifying transistor N14 adjusts a magnitude of a first mirroring current MIRRI0, which flows from the third intermediate node MN3 to the VSS terminal in response to the voltage level of the eighth intermediate node MN8.

The second connection transistor N15 is coupled between the determination node S0 and a fourth intermediate node MN4, and a gate receiving a second bit A1 of the amplifying code A<0:3>. The second connection transistor N15 controls a connection between the determination node S0 and the fourth intermediate node MN4 in response to the second bit A1 of the amplifying code A<0:3>.

The second amplifying transistor N16 is coupled between the fourth intermediate node MN4 and the VSS terminal, and a gate receiving the voltage level of the eighth intermediate node MN8. The second amplifying transistor N16 adjusts a magnitude of a second mirroring current MIRRI1, which flows from the fourth intermediate node MN4 to the VSS terminal in response to the voltage level of the eighth intermediate node MN8.

The third connection transistor N17 is coupled between the determination node S0 and a fifth intermediate node MN5, and a gate receiving a third bit A2 of the amplifying code A<0:3>. The third connection transistor N17 controls a connection between the determination node S0 and the fifth intermediate node MN5 in response to the third bit A2 of the amplifying code A<0:3>.

The third amplifying transistor N18 is coupled between the fifth intermediate node MN5 and the VSS terminal, and a gate receiving the voltage level of the eighth intermediate node MN8. The third amplifying transistor N18 adjusts a magnitude of a third mirroring current MIRRI2, which flows from the fifth intermediate node MN5 to the VSS terminal in response to the voltage level of the eighth intermediate node MN8.

The fourth connection transistor N19 is coupled between the determination node S0 and a sixth intermediate node MN6, and a gate receiving a fourth bit A3 of the amplifying code A<0:3>. The fourth connection transistor N19 controls a connection between the determination node S0 and the sixth intermediate node MN6 in response to the fourth bit A3 of the amplifying code A<0:3>.

The fourth amplifying transistor N20 is coupled between the sixth intermediate node MN6 and the VSS terminal, and a gate receiving the voltage level of the eighth intermediate node MN8. The fourth amplifying transistor N20 adjusts a magnitude of a fourth mirroring current MIRRI3, which flows from the sixth intermediate node MN6 to the VSS terminal in response to the voltage level of the eighth intermediate node MN8.

The reference current generating unit 440 generates a reference current REFI having a predetermined magnitude.

More specifically, the reference current generating unit 440 includes a reference control transistor PR, which is coupled between the VDD terminal and the determination node S0, and a gate receiving a reference control voltage VCTRL. The reference control transistor PR adjusts a magnitude of a reference current REFI, which flows between the VDD terminal and the determination node S0 in response to the reference control voltage VCTRL.

The state determination unit 420 compares a magnitude of the reference current REFI with a magnitude of the amplified current MIRRI<0:3> and determines the state of the memory cell coupled to the bit line BL based on a comparison result. The state determination unit 420 includes a level determination unit 422 and a logic level determination unit 424.

The level determination unit 422 determines a voltage level of the determination node S0 based on a magnitude difference between the reference current REFI as a sinking current and the amplified current MIRRI<0:3> as a sourcing current by providing the reference current REFI as the sinking current to the determination node S0 and by providing the amplified current MIRRI<0:3> as the sourcing current to the determination node S0. That is, an entire configuration of the level determination unit 422 represents that the determination node S0 is coupled between the current amplifying unit 404 and the reference current generating unit 440.

The logic level determination unit 424 determines a logic level of the determination signal QS and an inverted determination signal QS_N by determining the voltage level of the determination node S0 as a logic level on the basis of a logic determination level.

More specifically, the logic level determination unit 424 includes a sourcing precharge transistor P13, a connection control transistor N7, a determination transistor N8, a first inverter INV1, a second inverter INV2, a determination reset transistor N9, a determination setting transistor N10, and a sinking transistor N11. Since the above transistors provided in the logic level determination unit 424 are substantially the same as constituent elements of the logic level determination unit 324 illustrated in FIG. 3, their detailed description will be omitted.

Hereinafter, an operation of the page buffer of the flash memory device for reading the cell data using the current sensing manner in accordance with the second embodiment of the present invention will be described below.

The operation of the page buffer of the flash memory device in accordance with the second embodiment of the present invention includes a precharge operation period and a sensing operation period.

During the precharge operation period, signals PRECH-MR_N, PRECHSO_N, BLPRE_N related to a precharge operation and a signal SRST related to an initializing operation are activated, and a voltage level of nodes for performing a normal sensing operation period is set.

For example, during the precharge operation period, the sensing node MR, the determination node S0, and the bit line BL are coupled to the VDD terminal and are set to the power supply voltage VDD. Moreover, during the precharge operation period, the QS terminal is coupled to the VSS terminal and is set to the ground voltage VSS. The inverted determination signal QS_N is set to the power supply voltage VDD.

In order to enter the sensing operation period, the mirroring/amplifying unit 400, the reference current generating unit 340, and the state determination unit 420 operate as signals PBSENSE, SA_EN, A<0:3>, SSET, VCTRL related to the sensing operation and are activated at a suitable time.

First, at the timing that the level fixing signal PBSENSE and the sensing enable signal SA_EN are enabled, the bit line BL, the sourcing node CS0, and the sensing node MR are coupled with one another. The magnitude of the sensing current SENSI, which flows from the sensing node MR to the bit line BL, is determined based on the state of the memory cell coupled to the bit line.

For example, when the state of the memory cell coupled to the bit line BL is an erase state, since current having a relatively large magnitude may flow on the memory cell, the sensing current having a relatively large magnitude may flow from the sensing node MR to the memory cell via the sourcing node CS0 and the bit line BL.

When the state of the memory cell coupled to the bit line BL is a program state, since current may not flow on the memory cell, the sensing current having a relatively small magnitude may flow from the sensing node MR to the memory cell via the sourcing node CS0 and the bit line BL.

In a state that the voltage level of the bit line BL is fixed to a predetermined voltage level VBL, the magnitude of the sensing current SENSI, which flows on the bit line BL, is varied since the level fixing transistor N2 is coupled between the sourcing node CS0 and the bit line BL. That is, the level fixing signal PBSENSE inputted to the gate of the level fixing transistor N2 is set to a voltage level as a combined voltage of the threshold voltage VTH of the level fixing transistor N2 and the predetermined voltage level VBL. Thus, when a state that the voltage level of the sourcing node CS0 is higher than the predetermined voltage level VBL, the bit line BL may have the predetermined voltage level VBL. Since the level fixing transistor N2 is turned on in response to the level fixing signal PBSENSE, the level fixing transistor N2 does not have any influence on the sensing current SENSI, which flows between the sourcing node CS0 and the bit line BL.

Meanwhile, as the sensing current SENSI is outputted from the sensing node MR, the voltage level of the sensing node MR is lowered, and the sensing node MR is coupled to the VDD terminal. As a result, the magnitude of the sensing current SENSI, which is once determined based on the state of the memory cell, may be maintained during the sensing operation period.

Since the magnitude of the sensing current SENSI is determined by the voltage level of the sensing node MR based on the state of the memory cell coupled to the bit line BL, the current amplifying unit 404 may generate the amplified current MIRRI<0:3> having a magnitude substantially the same as the sensing current SENSI. A current amount of the amplified current MIRRRI<0:3> provided to the determination node S0 may be varied in response to the amplifying code A<0:3>.

For example, when the first bit A0 of the amplifying code A<0:3> is activated and the other bits A<1:3> are inactivated, only the first mirroring current MIRRI0 is generated and provided to the determination node S0. That is, the current amplifying unit 404 provides the first mirroring current MIRRI0 to the determination node S0.

When the first bit A0 of the amplifying code A<0:3> is inactivated and the other bits A<1:3> are activated, the second to fourth mirroring current MIRRI<1:3> are generated and provided to the determination node S0 in parallel. That is, the current amplifying unit 404 provides the second to fourth mirroring current MIRRI<1:3> to the determination node S0. Herein, a current amount of the second to fourth mirroring current MIRRI<1:3> becomes an amount to amplify the sensing current SENSI three times.

That is, the current amplifying unit 404 provides the amplified current MIRRI<0:3> to the determination node S0 by amplifying the sensing current SENSI in response to the amplifying code A<0:3>.

For reference, in the drawings, since the amplifying code A<0:3> is a signal having four bits, the current amplifying unit 404 may amplify the sensing current SENSI by first to fourth times. However, in another embodiment of the present invention, the amplifying code may be a signal having bits less or more than four, and the current amplifying unit may adjust a multiple times for amplifying the sensing current SENSI in response to the amplifying code.

Meanwhile, since the amplified current MIRRI<0:3> generated from the current amplifying unit 404 flows between the VSS terminal and the determination node S0, the amplified current MIRRI<0:3> as the sinking current may be provided to the determination node S0. Since the reference current REFI generated from the reference current generating unit 440 flows between the determination node S0 and the VDD terminal, the reference current REFI as the sourcing current may be provided to the determination node S0.

As described above, since the amplified current MIRRI<0:3> as the sinking current and the reference current REFI as the sourcing current are combined at the determination node S0, when the magnitude of the amplified current MIRRI<0:3> is larger than that of the reference current REFI, the determination node S0 may be maintained at a low voltage level, and, when the magnitude of the amplified current MIRRI<0:3> is smaller than that of the reference current REFI, the determination node S0 may be maintained at a high voltage level. That is, the voltage level of the determination node S0 may be varied based on a combined result of the amplified current MIRRI<0:3> and the reference current REFI at the determination node S0.

For example, when the state of the memory cell coupled to the bit line BL is the erase state, and the magnitude of the sensing current SENSI and the amplified current MIRRI<0:3> is relatively large, the magnitude of the amplified current MIRRI<0:3> is larger than the magnitude of the reference current REFI. Thus, the determination node S0 may have a voltage level close to that of the ground voltage VSS.

When the state of the memory cell coupled to the bit line BL is the program state, and the magnitude of the sensing current SENSI, and the amplified current MIRRI<0:3> is relatively small, the magnitude of the amplified current MIRRI<0:3> is smaller than the magnitude of the reference current REFI. Thus, the determination node S0 may have a voltage level close to that of the power supply voltage VDD.

The state determination unit 420 determines the logic level of the determination signal QS by determining whether the voltage level of the determination node S0 is higher than the logic determination level or not.

For example, when the determination node S0 has a voltage level close to that of the power supply voltage VDD, the determination signal QS has a logic high level. When the determination node S0 has a voltage level close to that of the ground voltage VSS, the determination signal QS has a logic low level.

More specifically, the state determination unit 420 activates the determination setting signal SSET at the time of a sufficient variation of the voltage level of the determination node S0 by combining the amplified current MIRRI<0:3> and the reference current REFI for a sufficient time. The logic level of the determination signal QS is determined by varying the voltage level of the QS_N output terminal in response to an activation of the determination setting signal SSET.

For example, during the precharge operation period, the sourcing node CS0 and the QS_N output terminal are precharged with the power supply voltage VDD. When the voltage level of the determination node S0 is varied to a voltage level close to that of the power supply voltage VDD after the amplified current MIRRI<0:3> and the reference current REFI are combined, the QS_N output terminal is coupled to the VSS terminal while the determination setting signal SSET is activated. Thus, the inverted determination signal QS_N is set to the logic low level, and the determination signal QS is set to the logic high level.

Moreover, when the voltage level of the determination node S0 is varied to a voltage level close to that of the ground voltage VSS after the amplified current MIRRI<0:3> and the reference current REFI are combined, the QS_N output terminal is not coupled to the VSS terminal while the determination setting signal SSET is activated. Thus, the inverted determination signal QS_N maintains the logic high level, and the determination signal QS maintains the logic low level.

After the logic level of the determination signal QS is determined, it may be determined that the state of the memory cell coupled to the bit line BL is the erase state or the program state. Moreover, in aforementioned operation, while the voltage level of the bit line BL is fixed to the predetermined voltage level VBL, the logic level of the determination signal QS is determined based on the magnitude of the sensing current SENSI. Thus, it may solve the concern that it takes an extended time to determine the state of the memory cell. That is, since a loading caused by a length between the sensing node MR and the sourcing node CS0 is smaller than a loading caused by a length of the bit line BL, the logic level of the determination signal QS may be determined by variation of the voltage level, which is sensitive and rapid to the state of the memory cell.

Moreover, the amplified current MIRRI<0:3> has a magnitude that is generated by amplifying the sensing current SENSI by a multiple determined by the amplifying code A<0:3>. Thus, if the state of the memory cell is definitely distinguished between the erase state and the program state, the magnitude of the sensing current SENSI is relatively large. Accordingly, the logic level of the determination signal QS may be determined on the basis of the amplified current MIRRI<0:3>, which is generated by amplifying the sensing current SENSI by one time.

When the state of the memory cell is not definitely distinguished between the erase state and the program state, e.g., in the case that, although the state of the memory cell is the erase state, the memory cell has a threshold voltage close to the program state, or, in the case that, although the state of the memory cell is the program state, the memory cell has a threshold voltage close to the erase state, the magnitude of the sensing current SENSI is relatively small. Accordingly, the logic level of the determination signal QS may be determined on the basis of the magnitude of the amplified current MIRRI<0:3>, which is generated by amplifying the sensing current SENSI by a multiple in response to the amplifying code A<0:3>. Thus, the logic level of the determination signal QS may be easily determined on the basis of the magnitude of the amplified current MIRRI<0:3>.

That is, the page buffer of the flash memory device in accordance with the second embodiment of the present invention illustrated in FIG. 4 may overcome the concerns of the page buffer of the flash memory shown in FIG. 2.

Figure 5:
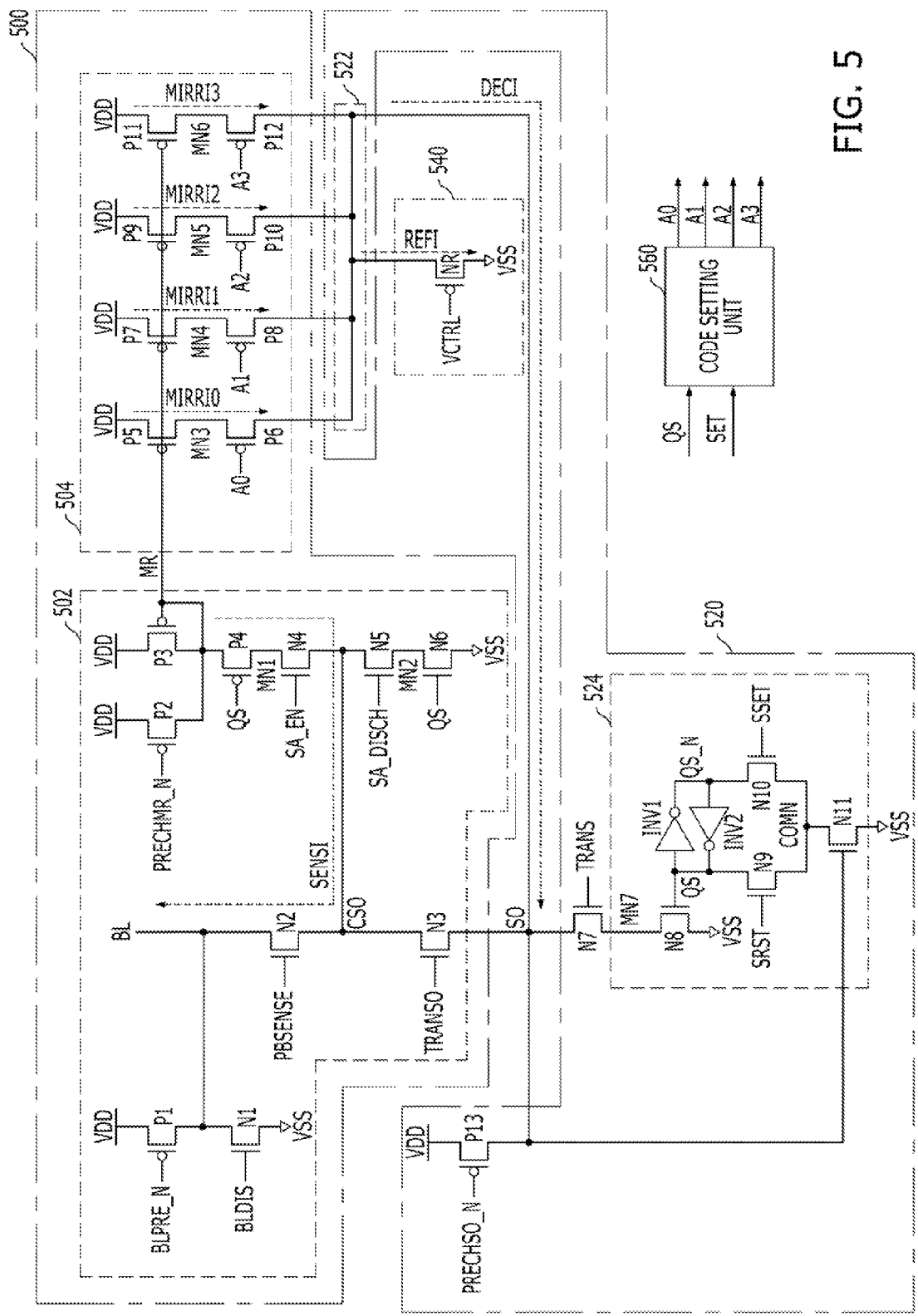
FIG. 5 is a circuit diagram illustrating a page buffer of a flash memory device for reading a cell data using a current sensing manner in accordance with a third embodiment of the present invention.

FIG. 5 is a circuit diagram illustrating a page buffer of a flash memory device for reading a cell data using a current sensing manner in accordance with a third embodiment of the present invention.

As illustrated in FIG. 5, the page buffer of the flash memory device for reading the cell data using the current sensing manner in accordance with the third embodiment of the present invention includes a mirroring/amplifying unit 500, a reference current generating unit 540, a state determination unit 520, and a code setting unit 560.

Since the configurations of a mirroring/amplifying unit 500, a reference current generating unit 540, and a state determination unit 520 illustrated in FIG. 5 are the same as those of the mirroring/amplifying unit 300, a reference current generating unit 340 and the state determination unit 320 illustrated in FIG. 3, the detailed descriptions of the mirroring/amplifying unit 500, the reference current generating unit 540, and the state determination unit 520 shown in FIG. 5 will be omitted.

However, the state determination unit 520 will be further described below.

The state determination unit 520 determines a first state of a memory cell by comparing a first amplified current MIRRI<0:3> with a reference current REFI and determines a second state of the memory cell by selectively comparing a second amplified current MIRRI<0:3> with the reference current REFI in response to a first determined result.

That is, the state determination unit 520 compares the first amplified current MIRRI<0:3> with the reference current REFI and determines a logic level of a determination signal QS in response to whether the memory cell coupled to the bit line BL is set to the first state. When it is assumed that an initial state of the determination signal QS is a disable state, the determination signal QS may be shifted from the disable state to an enable state when the memory cell is set to the first state, but the determination signal QS may maintain the disable state when the memory cell is not set to the first state.

Subsequently, the state determination unit 520 selectively compares the second amplified current MIRRI<0:3> with the reference current REFI in response to the determination signal QS. The state determination unit 520 determines whether the memory cell coupled to the bit line BL is set to the second state based on a comparison result.

That is, when the memory cell is set to the first state, it is unnecessary to determine whether the memory cell is set to the second state or not. Thus, when the determination signal QS becomes the enable state, a comparison operation of the second amplified current MIRRI<0:3> and the reference current REFI is not performed.

However, when the memory cell is not set to the first state, it is necessary to determine whether the memory cell is set to the second state or not. Thus, when the determination signal QS becomes the disable state, it is determined that the memory cell is set to the second state by performing the comparison operation of the second amplified current MIRRI<0:3> and the reference current REFI.

For reference, since the first amplified current MIRRI<0:3> and the second amplified current MIRRI<0:3> are generated by the same configuration using a same manner at only a different time, the reference numerals of the first amplified current MIRRI<0:3> and the second amplified current MIRRI<0:3> are same to each other.

The code setting unit 560 sets the amplifying code A<0:3> to a first value or a second value in response to the determination signal QS so that the mirroring/amplifying unit 500 generates the first amplified current MIRRI<0:3> or the second amplified current MIRRI<0:3>.

That is, after the logic level of the determination signal QS is determined in response to the first amplified current MIRRI<0:3>, the code setting unit 560 selectively sets the amplifying code A<0:3> to the second value in response to the logic level of the determination signal QS so that the mirroring/amplifying unit 500 generates the second amplified current MIRRI<0:3>.

In detail, if the determination signal QS is the disable state in response to the first amplified current MIRRI<0:3>, which is generated by setting the amplifying code A<0:3> to the first value and providing the amplifying code A<0:3> to the mirroring/amplifying unit 500, the code setting unit 560 sets the amplifying code A<0:3> to the second value so that the mirroring/amplifying unit 500 generates the second amplified current MIRRI<0:3>. If the determination signal QS is the enable state in response to the first amplified current MIRRI<0:3>, which is generated by setting the amplifying code A<0:3> to the first value and providing the amplifying code A<0:3> to the mirroring/amplifying unit 500, the code setting unit 560 does not set the amplifying code A<0:3> to the second value so that the mirroring/amplifying unit 500 does not generate the second amplified current MIRRI<0:3>.

Figure 6:
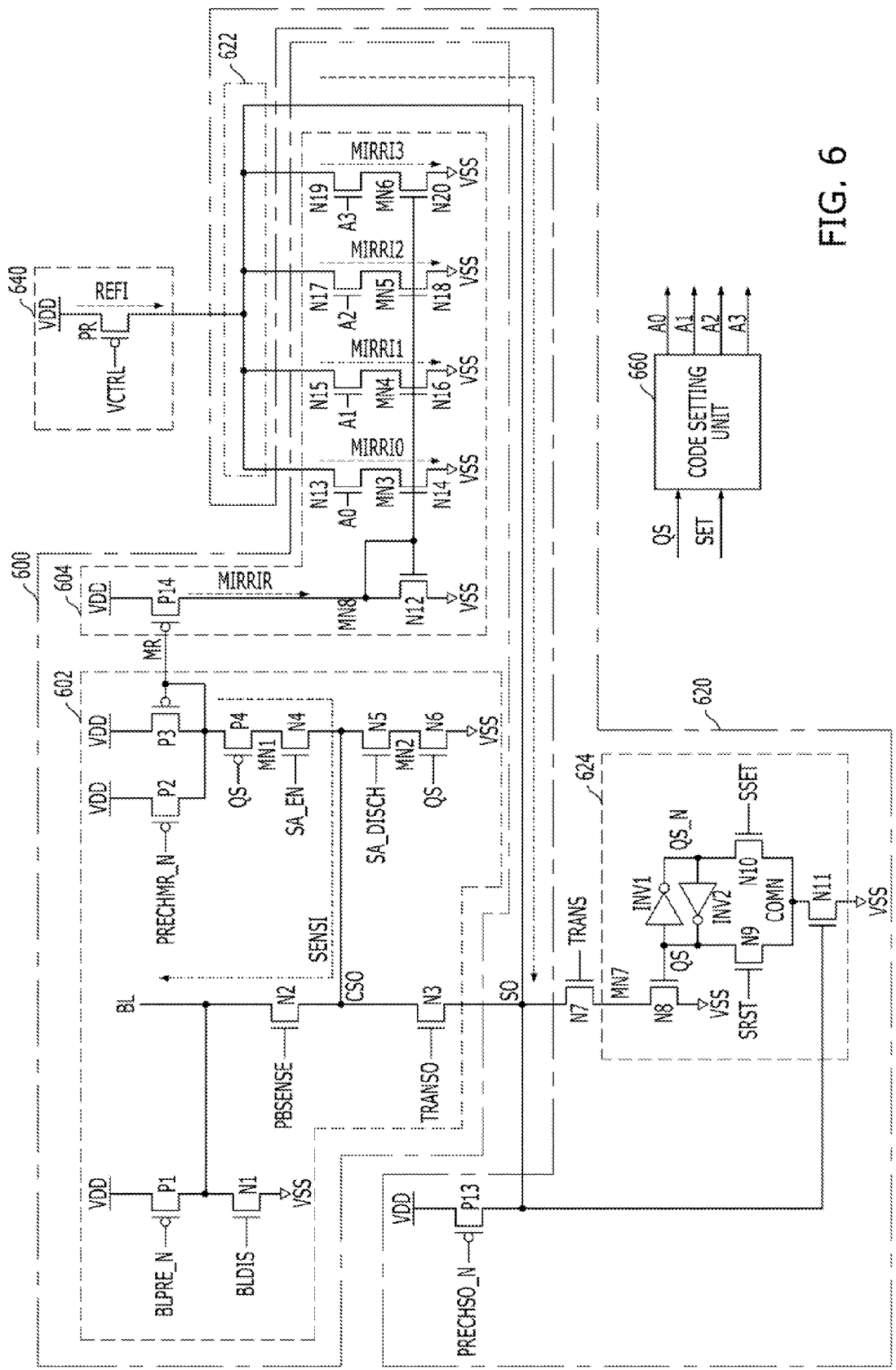
FIG. 6 is a circuit diagram illustrating a page buffer of a flash memory device for reading a cell data using a current sensing manner in accordance with a fourth embodiment of the present invention.

FIG. 6 is a circuit diagram illustrating a page buffer of the flash memory device for reading a cell data using a current sensing manner in accordance with a fourth embodiment of the present invention.

As illustrated in FIG. 6, the page buffer of a flash memory device for reading the cell data using a current sensing manner in accordance with the fourth embodiment of the present invention includes a mirroring/amplifying unit 600, a reference current generating unit 640, a state determination unit 620, and a code setting unit 660.

Since the configurations and operations of a mirroring/amplifying unit 600, a reference current generating unit 640, and a state determination unit 620 illustrated in FIG. 6 are same as those of the mirroring/amplifying unit 400, a reference current generating unit 440 and the state determination unit 420 illustrated in FIG. 4, the detailed descriptions of the mirroring/amplifying unit 600, the reference current generating unit 640, and the state determination unit 620 illustrated in FIG. 6 will be omitted.

However, the state determination unit 620 will be further described below.

The state determination unit 620 determines a first state of a memory cell by comparing a first amplified current MIRRI<0:3> with a reference current REFI and determines a second state of the memory cell by selectively comparing a second amplified current MIRRI<0:3> with the reference current REFI in response to a first determined result.

That is, the state determination unit 620 compares the first amplified current MIRRI<0:3> with the reference current REFI and determines a logic level of a determination signal QS in response to whether the memory cell coupled to the bit line BL is set to the first state. When it is assumed that an initial state of the determination signal QS is a disable state, the determination signal QS may be shifted from the disable state to an enable state when the memory cell is set to the first state, but the determination signal QS may maintain the disable state when the memory cell is not set to the first state.

Subsequently, the state determination unit 620 selectively compares the second amplified current MIRRI<0:3> with the reference current REFI in response to the determination signal QS. The state determination unit 620 determines whether the memory cell coupled to the bit line BL is set to the second state based on a comparison result.

That is, when the memory cell is set to the first state, it is unnecessary to determine whether the memory cell is set to the second state or not. Thus, when the determination signal QS becomes the enable state, a comparison operation of the second amplified current MIRRI<0:3> and the reference current REFI is not performed.

However, when the memory cell is not set to the first state, it is necessary to determine whether the memory cell is set to the second state or not. Thus, when the determination signal QS becomes the disable state, it is determined that the memory cell is set to the second state by performing the comparison operation of the second amplified current MIRRI<0:3> and the reference current REFI.

For reference, since the first amplified current MIRRI<0:3> and the second amplified current MIRRI<0:3> are generated by the same configuration using a same manner at only a different time, the reference numerals of the first amplified current MIRRI<0:3> and the second amplified current MIRRI<0:3> are same to each other.

The code setting unit 660 sets the amplifying code A<0:3> to a first value or a second value in response to the determination signal QS so that the mirroring/amplifying unit 600 generates the first amplified current MIRRI<0:3> or the second amplified current MIRRI<0:3>.

That is, after the logic level of the determination signal QS is determined in response to the amplified current MIRRI<0:3>, the code setting unit 660 selectively sets the amplifying code A<0:3> to the second value in response to the logic level of the determination signal QS so that the mirroring/amplifying unit 600 generates the second amplified current MIRRI<0:3>.

In detail, if the determination signal QS is the disable state in response to the first amplified current MIRRI<0:3>, which is generated by setting the amplifying code A<0:3> to the first value and providing the first amplifying code A<0:3> to the mirroring/amplifying unit 600, the code setting unit 660 sets the amplifying code A<0:3> to the second value so that the mirroring/amplifying unit 600 generates the second amplified current MIRRI<0:3>. If the determination signal QS is the enable state in response to the first amplified current MIRRI<0:3>, which is generated by setting the amplifying code A<0:3> to the first value and providing the amplifying code A<0:3> to the mirroring/amplifying unit 600, the code setting unit 660 does not set the amplifying code A<0:3> to the second value so that the mirroring/amplifying unit 600 does not generate the second amplified current MIRRI<0:3>.

Figure 7:
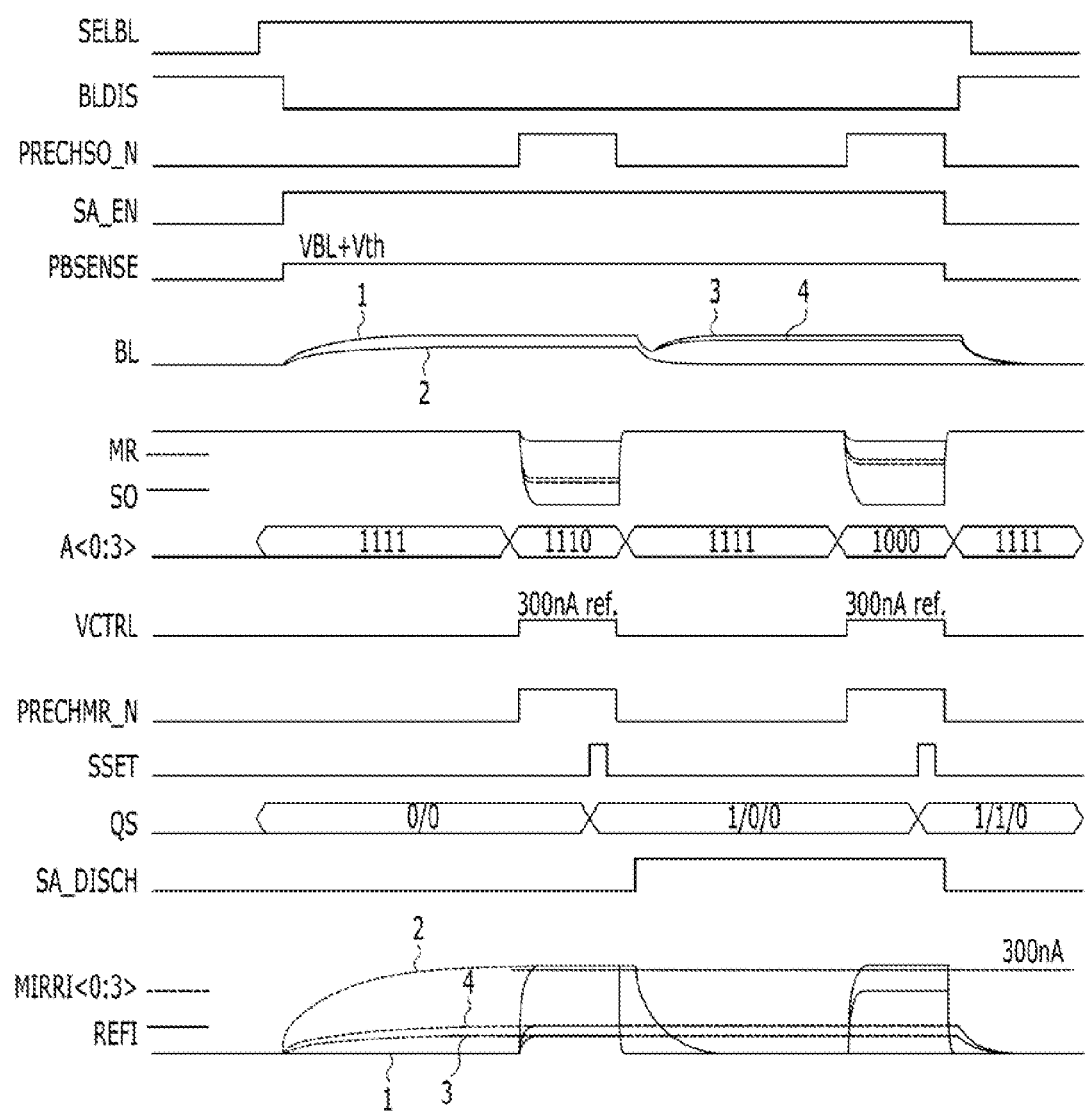
FIG. 7 is a timing diagram illustrating an operation of a page buffer of a flash memory device for reading a cell data using a current sensing manner shown in FIGS. 5 and 6.

FIG. 7 is a timing diagram illustrating an operation of a page buffer of a flash memory device for reading a cell data using a current sensing manner illustrated in FIGS. 5 and 6.

Referring to FIGS. 5 to 7, the operation of the page buffer of the flash memory device for reading the cell data using the current sensing manner will be described below.

First, the operation of the page buffer of the flash memory includes a precharge operation period and a sensing operation period. The sensing operation period includes a first sensing operation period that the amplifying code A<0:3> is set to the first value and a second sensing operation that the amplifying code A<0:3> is set to the second value.

That is, after a precharge operation is performed, a first sensing operation is performed and then a second sensing operation is performed. The first sensing operation is same as the second sensing operation except that the amplifying code A<0:3> is set to the first value "1110" of FIG. 7 and the second value "1000" of FIG. 7. Thus, the detailed descriptions will be explained below based on the operation difference between the first sensing operation and the second sensing operation.

During the precharge operation period, signals PRECHMR_N, PRECHS0_N and BLPRE_N related to the precharge operation are activated, and the voltage level of the nodes MR, BL, S0 for performing a normal sensing operation are set. For example, during the precharge operation period, the sensing node MR, the determination node S0 and the bit line BL, which is selected in response to a bit line selection signal SELBL are coupled to the VDD terminal and are set to the power supply voltage VDD. Herein, a signal SRST related to an initializing operation is not activated during the precharge operation period between the first sensing operation period and the second sensing operation period. The logic levels of the determination signal QS and the inverted determination signal QS_N that are determined based on an operation result of the first sensing operation, are maintained during the second sensing operation period.

Meanwhile, in order to enter the first sensing operation period or the second sensing operation period, the mirroring/amplifying unit 500 or 600, the reference current generating unit 540 or 640, and the state determination unit 520 or 620 operate accordingly, as signals PBSENSE, SA_EN, A<0:3>, SSET, VCTRL related to the sensing operation are activated at an appropriate timing.

More specifically, the code setting unit 560 or 660 maintains a code "1111" for disabling the current amplifying unit 504 or 604 to prevent the generation of the amplified current MIRRI<0:3> during the precharge operation period. The code setting unit 560 or 660 changes the code "1111" to the first value "1110" and generates the first amplified current MIRRI<0:3> during the first sensing operation period. When the first sensing operation is terminated and the precharge operation is re-performed, the code setting unit 560 or 660 maintains the code "1111" for disabling the current amplifying unit 504 and 604 to prevent the generation of the amplified current MIRRI<0:3>. The code setting unit 560 or 660 changes the code "1111" to the second value "1000" and generates the second amplified current MIRRI<0:3> during the second sensing operation period. The second sensing operation may be performed or not based on the operation result of the first sensing operation.

When the first sensing operation or the second sensing operation start, the bit line BL, the sourcing node CS0, and the sensing node MR are coupled to one another when the level fixing signal PBSENSE and the sensing enable signal SA_EN are activated. The magnitude of the sensing current SENSI, which flows from the sensing node MR to the bit line BL, is determined based on the state of the memory cell coupled to the bit line BL.

For example, if the state of the memory cell is the erase state, since current having a relatively large magnitude flows on the memory cell, the sensing current SENSI having the relatively large magnitude may flow from the sensing node MR to the memory cell via the sourcing node CS0 and the bit line BL. If the state of the memory cell is the program state, since current does not flow on the memory cell, the sensing current SENSI having the relatively small magnitude may flow from the sensing node MR to the memory cell via the sourcing node CS0 and the bit line BL.

In a state that the voltage level of the bit line BL is fixed to a predetermined voltage level VBL, the magnitude of the sensing current SENSI, which flows on the bit line BL, is varied since the level fixing transistor N2 is coupled between the sourcing node CS0 and the bit line BL. That is, the level fixing signal PBSENSE inputted to the gate of the level fixing transistor N2 is set to a voltage level as a combined voltage of the threshold voltage VTH of the level fixing transistor N2 and the predetermined voltage level VBL. Thus, while the voltage level of the sourcing node CS0 is higher than the predetermined voltage level VBL, the bit line BL may have the predetermined voltage level VBL. Since the level fixing transistor N2 is turned on in response to the level fixing signal PBSENSE, the level fixing transistor N2 does not have any influence on the sensing current SENSI, which flows between the sourcing node CS0 and the bit line BL.

Meanwhile, as the sensing current SENSI is outputted from the sensing node MR, the voltage level of the sensing node MR is lowered, and the sensing node MR is coupled to the VDD terminal. As a result, the magnitude of the sensing current SENSI, which is once determined based on the state of the memory cell, may be maintained during the sensing operation period.

Since the magnitude of the sensing current SENSI is determined by the voltage level of the sensing node MR based on the state of the memory cell coupled to the bit line BL, the current amplifying unit 504 or 604 may generate the amplified current MIRRI<0:3> having a magnitude substantially the same as the sensing current SENSI. A current amount of the amplified current MIRRRI<0:3> provided to the determination node S0 may be varied in response to the amplifying code A<0:3>.

For example, when the first bit A0 of the amplifying code A<0:3> is activated and the other bits A<1:3> are inactivated, only the first mirroring current MIRRI0 is generated and provided to the determination node S0. That is, the current amplifying unit 504 or 604 provides the first mirroring current MIRRI0 to the determination node S0.

When the first bit A0 of the amplifying code A<0:3> is inactivated and the other bits A<1:3> are activated, the second to fourth mirroring current MIRRI<1:3> are generated and provided to the determination node S0 in parallel. That is, the current amplifying unit 504 or 604 provides the second to fourth mirroring current MIRRI<1:3> to the determination node S0. A current amount of the second to fourth mirroring current MIRRI<1:3> becomes an amount to amplify the sensing current SENSI three times.

That is, the current amplifying unit 504 or 604 provides the amplified current MIRRI<0:3> to the determination node S0 by amplifying the sensing current SENSI in response to the amplifying code A<0:3>.

For reference, in the drawings, since the amplifying code A<0:3> is a signal having four bits, the current amplifying unit 504 or 604 may amplify the sensing current SENSI by first to fourth times. However, in another embodiment of the present invention, the amplifying code may be a signal having bits less or more than four, and the current amplifying unit may adjust a multiple times for amplifying the sensing current SENSI in response to the amplifying code.

Meanwhile, the reference current REFI is compared with the first amplified current MIRRI<0:3> in response to the amplifying code A<0:3> having the first value "1110" during the first sensing operation period. Then, the logic level of the determination signal QS is determined based on the comparison result. That is, since, as described in an operation of aforementioned current amplifying unit 504 or 604, the fourth bit A<3> of the amplifying code A<0:3> is activated and the other bits A<0:2> are inactivated during the first sensing operation period, the first amplified current MIRRI<0:3> is generated by amplifying the sensing current SENSI by one time, and the logic level of the determination QS is determined by comparing the reference current SENSI with the first amplified current MIRRI<0:3>.

When the state of the memory cell is determined based on the first amplified current MIRRI<0:3>, if the magnitude of the sensing current SENSI, which flows on the memory cell, is not larger than the reference current REFI, the determination signal QS may be not enabled. That is, if the determination signal QS is enabled when the reference current REFI is set to have a relatively large value, the magnitude of the sensing current has a relatively large value.

For example, when the magnitude of the reference current REFI is set to a relatively large value, e.g., 300 nA, and the magnitude of the first amplified current MIRRI<0:3> having the same magnitude as the sensing current SENSI is smaller than 300 nA, the voltage level of the determination node S0 drops closely to the ground voltage VSS. Thus, the determination signal QS maintains the disable state.

However, when the magnitude of the reference current REFI is set to a relatively large value, e.g., 300 nA and the magnitude of the first amplified current MIRRI<0:3> having the same magnitude as the sensing current SENSI is larger than 300 nA, the voltage level of the determination node S0 has a voltage close to that of the power supply voltage VDD. Thus, the determination signal QS becomes the enable state.

When the determination signal QS is enabled, there is no consumed current during the second sensing operation period since a state determination of the memory cell is not performed during the second sensing operation period. Moreover, when the determination signal QS is disabled, the state determination of the corresponding memory cell is re-performed during the second sensing operation period.

As described above, the effect of the first sensing operation is to prevent an unnecessary current from being consumed by sensing the memory cell on which a relatively large current flow, namely, having the erase state with a relatively low threshold voltage before the second sensing operation is performed.

For reference, when a reading operation is repeatedly performed for the memory cell where a relatively large sensing current SENSI current flow, namely, the memory cell having the erase state with a relatively low threshold voltage, a ground voltage level of the memory cell may be swung.

Thus, as described above, if the memory cell, which is erased by the relatively low threshold voltage, is sensed before the second sensing operation performed, it may be expected to prevent the swing of the ground voltage level of the memory cell and prevent an over-consumption of the current.

Meanwhile, the reference current REFI is compared with the second amplified current MIRRI<0:3> generated in response to the amplifying code A<0:3> having the second value "1000" during the second sensing operation period. Then, the logic level of the determination signal QS is determined based on the comparison result. That is, since, as described in an operation of aforementioned current amplifying unit 504 and 604, the first bit A<0> of the amplifying code A<0:3> is inactivated and the other bits A<1:3> are activated during the second sensing operation period, the second amplified current MIRRI<0:3> is generated by amplifying the sensing current SENSI by three times, and the logic level of the determination QS is determined by comparing the reference current SENSI with the second amplified current MIRRI<0:3>.

When the state of the memory cell is determined based on the second amplified current MIRRI<0:3>, if the magnitude of the sensing current SENSI is not larger than the reference current REFI by one third (⅓), the determination signal QS may be not enabled. That is, when the reference current REFI is set to have a relatively large value, the enable state of the determination signal QS is determined on the basis of the sensing current SENSI having a relatively small value.

For example, when the magnitude of the reference current REFI is set to a relatively large value, e.g., 300 nA, and the magnitude of the sensing current SENSI is smaller than 100 nA, the magnitude of the second amplified current MIRRI<0:3> is smaller than 300 nA. Thus, the voltage level of the determination node S0 drops closely to the ground voltage VSS, and the determination signal QS maintains the disable state.

However, when the magnitude of the reference current REFI is set to a relatively large value, e.g., 300 nA, and the magnitude of the sensing current SENSI is larger than 100 nA, the amplitude of the second amplified current MIRRI<0:3> is larger than 300 nA. Thus, the voltage level of the determination node S0 does not drop to have the power supply voltage VDD, and the determination signal QS is enabled.

As described above, the effect of the first sensing operation is to determine the state of the memory cell on which a relatively small current flow, namely, having the erase state with a relatively high threshold voltage.

As illustrated in FIG. 5, since the first amplified current MIRRI<0:3> or the second amplified current MIRRI<0:3> flows between the VDD terminal and the determination node S0, the first amplified current MIRRI<0:3> or the second amplified current MIRRI<0:3> as the sourcing current may be provided to the determination node S0. Since the reference current REFI generated from the reference current generating unit 540 flows between the determination node S0 and the VSS terminal, the reference current REFI as the sinking current may be provided to the determination node S0.

As described above, since the first amplified current MIRRI<0:3> or the second amplified current MIRRI<0:3> as the sourcing current and the reference current REFI as the sinking current are combined at the determination node S0, when the magnitude of the first amplified current MIRRI<0:3> or the second amplified current MIRRI<0:3> is larger than that of the reference current REFI, the determination node S0 may be maintained at a high voltage level, and, when the magnitude of the first amplified current MIRRI<0:3> or the second amplified current MIRRI<0:3> is smaller than that of the reference current REFI, the determination node S0 may be maintained at a low voltage level. That is, the voltage level of the determination node S0 may be varied based on a combined result of the first amplified current MIRRI<0:3> or the second amplified current MIRRI<0:3> and the reference current REFI at the determination node S0.

For example, when the state of the memory cell coupled to the bit line BL is the erase state and the magnitude of the sensing current SENSI and the first amplified current MIRRI<0:3> or the second amplified current MIRRI<0:3> is relatively large, the magnitude of the first amplified current MIRRI<0:3> or the second amplified current MIRRI<0:3> is larger than the magnitude of the reference current REFI. Thus, the determination node S0 may have a voltage level close to that of the power supply voltage VDD.

Moreover, when the state of the memory cell coupled to the bit line BL is the program state and the magnitude of the sensing current SENSI and the first amplified current MIRRI<0:3> or the second amplified current MIRRI<0:3> is relatively small, the magnitude of the first amplified current MIRRI<0:3> or the second amplified current MIRRI<0:3> is smaller than the magnitude of the reference current REFI. Thus, the determination node S0 may have a voltage level close to that of the ground voltage VSS.

As illustrated in FIG. 6, since the first amplified current MIRRI<0:3> or the second amplified current MIRRI<0:3> flows between the VSS terminal and the determination node S0, the first amplified current MIRRI<0:3> or the second amplified current MIRRI<0:3> as the sinking current may be provided to the determination node S0. Since the reference current REFI generated from the reference current generating unit 640 flows between the determination node S0 and the VDD terminal, the reference current REFI as the sourcing current may be provided to the determination node S0.

As described above, the first amplified current MIRRI<0:3> or the second amplified current MIRRI<0:3> as the sinking current and the reference current REFI as the sourcing current are combined at the determination node S0. Thus, when the magnitude of the first amplified current MIRRI<0:3> or the second amplified current MIRRI<0:3> is larger than that of the reference current REFI, the voltage level of the determination node S0 may be maintained at a low voltage level. When the magnitude of the first amplified current MIRRI<0:3> or the second amplified current MIRRI<0:3> is smaller than that of the reference current REFI, the voltage level of the determination node S0 may be maintained at a high voltage level. That is, the voltage level of the determination node S0 may be varied based on a combined result of the first amplified current MIRRI<0:3> or the second amplified current MIRRI<0:3> and the reference current REFI at the determination node S0.

For example, when the state of the memory cell coupled to the bit line BL is the erase state and the magnitude of the sensing current SENSI and the first amplified current MIRRI<0:3> or the second amplified current MIRRI<0:3> is relatively large, the magnitude of the first amplified current MIRRI<0:3> or the second amplified current MIRRI<0:3> is larger than the magnitude of the reference current REFI. Thus, the determination node S0 may have a voltage level close to that of the ground voltage VSS.

Moreover, when the state of the memory cell coupled to the bit line BL is the program state and the magnitude of the sensing current SENSI and the first amplified current MIRRI<0:3> or the second amplified current MIRRI<0:3> is relatively small, the magnitude of the first amplified current MIRRI<0:3> or the second amplified current MIRRI<0:3> is smaller than the magnitude of the reference current REFI. Thus, the determination node S0 may have a voltage level close to that of the power supply voltage VDD.

Therefore, the state determination unit 520 or 620 determines the logic level of the determination signal QS by determining whether or not the voltage level of the determination node S0 is higher than the logic determination level based on a combined result of the reference current REFI and the first amplified current MIRRI<0:3> or the second amplified current MIRRI<0:3>.

For example, when the determination node S0 has a voltage level close to the power supply voltage VDD, the determination signal QS has a logic high level. Moreover, when the determination node S0 has a voltage level close to that of the ground voltage VSS, the determination signal QS has a logic low level.

More specifically, the state determination unit 520 or 620 activates the determination setting signal SSET at the timing of a sufficient variation of the voltage level of the determination node S0 by combining the first amplified current MIRRI<0:3> or the second amplified current MIRRI<0:3> and the reference current REFI for a sufficient time. The logic level of the determination signal QS is determined by varying or maintaining the voltage level of the QS_N output terminal in response to the activation of the determination setting signal SSET.

For example, during the precharge operation period, the sourcing node CS0 and the QS_N output terminal are precharged with the power supply voltage VDD. When the voltage level of the determination node S0 is varied to a voltage level close to that of the power supply voltage VDD after the first amplified current MIRRI<0:3> or the second amplified current MIRRI<0:3> and the reference current REFI are combined, the QS_N output terminal is coupled to the VSS terminal while the determination setting signal SSET is activated. Thus, the inverted determination signal QS_N is set to the logic low level, and the determination signal QS is set to the logic high level.

Moreover, when the voltage level of the determination node S0 is varied to a voltage level close to the ground voltage VSS after the first amplified current MIRRI<0:3> or the second amplified current MIRRI<0:3> and the reference current REFI are combined, the QS_N output terminal is not coupled to the VSS terminal while the determination setting signal SSET is activated. Thus, the inverted determination signal QS_N maintains the logic high level, and the determination signal QS maintains the logic low level.

After the logic level of the determination signal QS is determined, it may be determined that the state of the memory cell coupled to the bit line BL is the erase state or the program state. Moreover, in aforementioned operation, while the voltage level of the bit line BL is fixed to the predetermined voltage level VBL, the logic level of the determination signal QS is determined by the magnitude of the sensing current SENSI. Thus, it may take a shorter amount of time to determine the state of the memory cell. That is, since the loading caused by a length between the sensing node MR and the sourcing node CS0 is smaller than the loading caused by a length of the bit line BL, the logic level of the determination signal QS may be determined by variation of the voltage level, which is sensitive and rapid to the state of the memory cell.

Moreover, the first amplified current MIRRI<0:3> or the second amplified current MIRRI<0:3> has a magnitude substantially the same as the sensing current SENSI, which is amplified by a multiple times in response to the amplifying code A<0:3>. Thus, if the state of the memory cell is definitely distinguished between the erase state and the program state, a magnitude of the sensing current SENSI is relatively large. Thus, the logic level of the determination signal QS may be determined on the basis of the first amplified current MIRRI<0:3> or the second amplified current MIRRI<0:3> that is generated by amplifying the sensing current SENSI by one time.

Furthermore, when the state of the memory cell is not definitely distinguished between the erase state and the program state, e.g., in the case that although the state of the memory cell is the erase state, the memory cell has a threshold voltage close to the program state, or, in the case that although the state of the memory cell is the program state, the memory cell has a threshold voltage close to the erase state. Thus, the magnitude of the sensing current SENSI is relatively small, the logic level of the determination signal QS may be determined on the basis of the magnitude of the first amplified current MIRRI<0:3> or the second amplified current MIRRI<0:3> that is generated by amplifying the sensing current SENSI by a multiple in response to the amplifying code A<0:3>. Thus, the logic level of the determination signal QS may be easily determined on the basis of the magnitude of the amplified current MIRRI<0:3>. That is, the page buffer of the flash memory device in accordance with third and fourth embodiments of the present invention illustrated in FIGS. 5 to 7 may overcome the concerns of the page buffer of the flash memory illustrated in FIG. 2.

As described above, a page buffer of a nonvolatile memory device for reading a cell data using a current sensing manner in accordance with embodiments of the present invention is explained with reference to FIGS. 3 to 7 since the page buffer is used in a nonvolatile memory device as a representative circuit using a current sensing manner. Meanwhile, the page buffer may be used in various integrated circuits.

For example, in aforementioned nonvolatile memory device, an operation using a current sensing manner for sensing a state of a memory cell may be used in an operation for sensing variation in a current amount in a fixing state of a voltage level of a signal transmission line coupled to an internal circuit. That is, if it is determined whether a predetermined internal circuit performs a predetermined operation or not by sensing variation in a current amount of a predetermined signal transmission line, this may be included in a scope of the present invention.

As described above, in accordance with exemplary embodiments of the present invention, an operation state of an internal circuit may be detected under a minimum sensing malfunction by detecting an operation state of an internal circuit on the basis of variation in an amplified current amount flowing on a signal transmission line coupled to an internal circuit.

Moreover, in a circuit for detecting an operation state of an internal circuit by sensing variation in a current amount flowing on a signal transmission line coupled to an internal circuit, an operation state of an internal circuit may be detected under a minimum consumed current amount since the operation state of the internal circuit is gradually detected and a performance of a subsequent operation may be controlled based on a sensed result.

While the present invention has been described with respect to the specific embodiments, it will be apparent to those skilled in the art that various changes, and modifications may be made without departing from the spirit and scope of the invention as defined in the following claims.

What is claimed is:

1. An integrated circuit comprising:
a mirroring/amplifying unit configured to mirror and amplify a sensing current that flows on a signal transmission line coupled to an internal circuit, and output an amplified current;
a reference current generating unit configured to generate a reference current; and
a state determination unit configured to compare the reference current with the amplified current and determine a state of the internal circuit based on a comparison result,
wherein the mirroring/amplifying unit comprises:
a current supply unit configured to selectively supply the sensing current between a sensing node and the internal circuit via the signal transmission line based on the state of the internal circuit; and
a current amplifying unit coupled to the current supply unit in a current mirror type, configured to amplify the sensing current by a multiple in response to an amplifying code, and provide the amplified current to a determination node,
wherein the current supply unit couples the sensing node to a power supply voltage terminal during a precharge operation period, and controls a magnitude of the sensing current, which flows between the sensing node and the power supply voltage terminal based on a voltage level of the sensing node during a sensing operation period,
wherein a voltage level of the sensing node is varied in response to a first state of the internal circuit, and the sensing current flows between the power supply voltage terminal and the internal circuit via the sensing node and the signal transmission line, and
wherein the voltage level of the sensing node is not varied in response to a second state of the internal circuit, and the sensing current does not flow between the power supply voltage terminal and the internal circuit.

2. The integrated circuit of claim 1, wherein the mirroring/amplifying unit adjusts a magnitude of the amplified current in response to an amplifying code.

3. The integrated circuit of claim 1, wherein the current amplifying unit provides the amplified current in response to the amplifying code as a sourcing current to the determination node by mirroring the sensing current, which flows between the sensing node and a power supply voltage terminal, between the power supply voltage terminal and the determination node during a sensing operation period.

4. The integrated circuit of claim 3, wherein the state determination unit comprises:
a level determination unit configured to determine a voltage level of the determination node based on a magnitude difference between the amplified current as a sourcing current and the reference current as a sinking current, the reference current flowing between the determination node and a ground voltage terminal; and
a logic level determination unit configured to determine the voltage level of the determination node as a logic level based on a logic determination level.

5. The integrated circuit of claim 1, wherein the current amplifying unit provides the amplified current in response to the amplifying code as a sinking current to the determination node by mirroring the sensing current, which flows between the sensing node and a power supply voltage terminal, between a ground voltage terminal and the determination node during a sensing operation period.

6. The integrated circuit of claim 5, wherein the state determination unit comprises:
a level determination unit configured to determine a voltage level of the determination node based on a magnitude difference between the amplified current as a sinking current and the reference current as a sourcing current, the reference current flowing between the determination node and the power supply voltage terminal; and
a logic level determination unit configured to determine the voltage level of the determination node as a logic level based on a logic determination level.

7. An integrated circuit comprising:
a mirroring/amplifying unit configured to mirror and amplify a sensing current that flows on a signal transmission line coupled to an internal circuit, output an amplified current, adjust a magnitude of the amplified current in response to an amplifying code, and be controlled in response to a determination signal;
a reference current generating unit configured to generate a reference current;
a state determination unit configured to determine a first state of the internal circuit by comparing the reference current with a first amplified current, determine a logic level of the determination signal in response to a first determination result, and determine a second state of the internal circuit by selectively comparing the reference current with a second amplified current in response to the determination signal; and a code setting unit configured to set the amplifying code to a first value or a second value, and control the mirroring/amplifying unit to generate the first amplified current or the second amplified current which is different from the first amplified current.

8. The integrated circuit of claim 7, wherein the mirroring/amplifying unit comprises:

a current supply unit configured to selectively supply the sensing current between a sensing node and the internal circuit via the signal transmission line based on the states of the internal circuit and the determination signal; and a current amplifying unit coupled to the current supply unit in a current mirror type, configured to amplify the sensing current by a multiple in response to the amplifying code, and generate the amplified current.

9. The integrated circuit of claim 7, wherein the state determination unit enables the determination signal when the internal circuit is set to the first state based on a comparison result of the first amplified current and the reference current, disables the determination signal when the internal circuit is not set to the first state, and determines the second state of the internal circuit based on a comparison result of the reference current and the second amplified current when the determination signal is disabled.

10. The integrated circuit of claim 8, wherein the current supply unit couples the sensing node to a power supply voltage terminal during a precharge operation period, and controls a magnitude of the sensing current, which flows between the sensing node and the power supply voltage terminal based on a voltage level of the sensing node during a sensing operation period, wherein when the determination signal is disabled during the sensing operation period, a voltage level of the sensing node is varied in response to the first state or the second state of the internal circuit, and the sensing current flows between the power supply voltage terminal and the internal circuit via the sensing node and the signal transmission line, and wherein when the determination signal is enabled during the sensing operation period, the current supply unit does not supply the sensing current between the sensing node and the signal transmission line irrespective of the states of the internal circuit.

11. The integrated circuit of claim 8, wherein the current amplifying unit provides the first amplified current or the second amplified current in response to the first amplifying code or the second amplifying code as a sourcing current to a determination node by mirroring the sensing current, which flows between the sensing node and a power supply voltage terminal, between the power supply voltage terminal and the determination node during a sensing operation period.

12. The integrated circuit of claim 11, wherein the state determination unit comprises:

a level determination unit configured to determine a voltage level of the determination node based on a magnitude difference between the first amplified current or the second amplified current as a sourcing current and the reference current as a sinking current, the reference current flowing between the determination node and a ground voltage terminal; and a logic level determination unit configured to determine the voltage level of the determination node as a logic level based on a logic determination level, and output the determination signal.

13. The integrated circuit of claim 8, wherein the current amplifying unit provides the first amplified current or the second amplified current in response to the amplifying code as a sinking current to the determination node by mirroring the sensing current, which flows between the sensing node and a power supply voltage terminal, between a ground voltage terminal and the determination node during a sensing operation period.

14. The integrated circuit of claim 13, wherein the state determination unit comprises:

a level determination unit configured to determine a voltage level of the determination node based on a magnitude difference between the first amplified current or the second amplified current as a sinking current and the reference current as a sourcing current, the reference current flowing between the determination node and the power supply voltage terminal; and a logic level determination unit configured to determine the voltage level of the determination node as a logic level based on a logic determination level, and output the determination signal.

15. The integrated circuit of claim 7, wherein the code setting unit sets the amplifying code to the first value and outputs the first value to the mirroring/amplifying unit during a sensing operation period, and the code setting unit sets the amplifying code to the second value and outputs the second value to the mirroring/amplifying unit when the determination signal is disabled during the sensing operation period, and does not set the amplifying code to the second value when the determination signal is enabled.

16. An operation method of an integrated circuit, the operating method comprising:

generating a reference current;

mirroring a sensing current that flows between a sensing node and a signal transmission line coupled to an internal circuit, amplifying the sensing current by a first multiple in response to a first amplifying code, and generating a first amplified current;

determining whether the internal circuit is set to a first state by comparing the reference current with the first amplified current;

based on a first determination result, mirroring the sensing current, amplifying the sensing current by a second multiple in response to a second amplifying code, and generating a second amplified current; and based on the first determination result, determining whether the internal circuit is set to a second state by comparing the reference current with the second amplified current, wherein the first multiple is smaller than the second multiple, and a current amount used in the internal circuit, which is set to the first state, is smaller than an amount of the reference current divided by the first multiple, and is larger than an amount of the reference current divided by the second multiple.

17. The operation method of claim 16, wherein when the internal circuit is not set to the first state, the generating a second amplified current is performed and the determining whether the internal circuit is set to a second state is performed, and when the internal circuit is set to the first state, the generating a second amplified current is not performed and the determining whether the internal circuit is set to a second state is not performed.

* * * * *